US012593147B2

(12) United States Patent (10) Patent No.: US 12,593,147 B2
Hsieh et al. (45) Date of Patent: Mar. 31, 2026

(54) STRUCTURES AND METHODS FOR PHASE DETECTION AUTO FOCUS

(71) Applicant: Taiwan Semiconductor Manufacturing Company, Ltd., Hsinchu (TW)

(72) Inventors: Feng-Chien Hsieh, Pingtung City (TW); Yun-Wei Cheng, Taipei City (TW); Wei-Li Hu, Tainan City (TW); Kuo-Cheng Lee, Tainan City (TW); Cheng-Ming Wu, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 372 days.

(21) Appl. No.: 18/325,707

(22) Filed: May 30, 2023

(65) Prior Publication Data

US 2024/0406596 A1 Dec. 5, 2024

(51) Int. Cl.
*H01L 21/66* (2006.01)
*H04N 25/704* (2023.01)
*H10F 39/00* (2025.01)
*H10F 39/18* (2025.01)

(52) U.S. Cl.
CPC ......... *H04N 25/704* (2023.01); *H10F 39/014* (2025.01); *H10F 39/18* (2025.01); *H10F 39/807* (2025.01)

(58) Field of Classification Search
CPC ..... H04N 25/704; H10F 39/014; H10F 39/18; H10F 39/807; H10F 39/8053; H10F 39/8063

USPC .......................................................... 257/292
See application file for complete search history.

(56) References Cited

U.S. PATENT DOCUMENTS

| 9,160,953 | B2 * | 10/2015 | Oishi | H10F 39/199 |
| 9,893,111 | B2 * | 2/2018 | Chou | H04N 25/76 |
| 10,002,899 | B2 * | 6/2018 | Chou | H04N 23/672 |
| 10,811,453 | B1 * | 10/2020 | Mun | H10F 39/024 |
| 10,957,727 | B2 * | 3/2021 | Lee | H10F 39/18 |
| 11,276,716 | B2 * | 3/2022 | Chou | H10F 39/802 |
| 11,710,752 | B2 * | 7/2023 | Liu | H10F 39/807 |
| | | | | 257/432 |
| 11,791,357 | B2 | 10/2023 | Wu et al. | |
| 11,955,497 | B2 | 4/2024 | Pyo et al. | |
| 12,349,493 | B2 * | 7/2025 | Lin | H10F 39/028 |
| 2021/0183922 | A1 * | 6/2021 | Chou | G01J 1/44 |

(Continued)

FOREIGN PATENT DOCUMENTS

| CN | 111508979 A | 8/2020 |
| CN | 112909034 A | 6/2021 |

(Continued)

OTHER PUBLICATIONS

Pending U.S. Appl. No. 18/169,642, entitled "Pixel Sensor Arrays and Methods of Formation," by Yang et al., filed Feb. 15, 2023.

*Primary Examiner* — Vu A Vu

(74) *Attorney, Agent, or Firm* — Harrity & Harrity, LLP

(57) ABSTRACT

In-pixel separation structures may divide photodiodes of a pixel array into multiple regions. As a result, a lens of an image sensor device may be focused by using combining signals associated with different portions of the photodiodes. As a result, the lens may be focused faster and with fewer pixels of the pixel array, which conserves power, processing resources, and raw materials.

20 Claims, 46 Drawing Sheets

600 —→

(56)          References Cited

U.S. PATENT DOCUMENTS

| | | |
|---|---|---|
| 2022/0190007 A1 | 6/2022 | Kim et al. |
| 2022/0278143 A1 | 9/2022 | Chen et al. |
| 2022/0285155 A1 | 9/2022 | Chiu et al. |
| 2022/0285203 A1 | 9/2022 | Chiu et al. |
| 2022/0359583 A1 | 11/2022 | Huang et al. |
| 2023/0215960 A1 | 7/2023 | Borthakur et al. |
| 2024/0186341 A1* | 6/2024 | Miyata ................ H10F 39/8023 |

FOREIGN PATENT DOCUMENTS

| | | |
|---|---|---|
| TW | 202015230 A | 4/2020 |
| TW | 202245148 A | 11/2022 |

* cited by examiner

200

202

316
314
312

310

308

306

304

302

300

310

320

330

310

310a
310b
310c

W
W 316
314
310
340

340

310

302

304

316

314

310

350

350

310

302

304

540

302

600

600

700

308

306

304

302

904

902

920

902

930

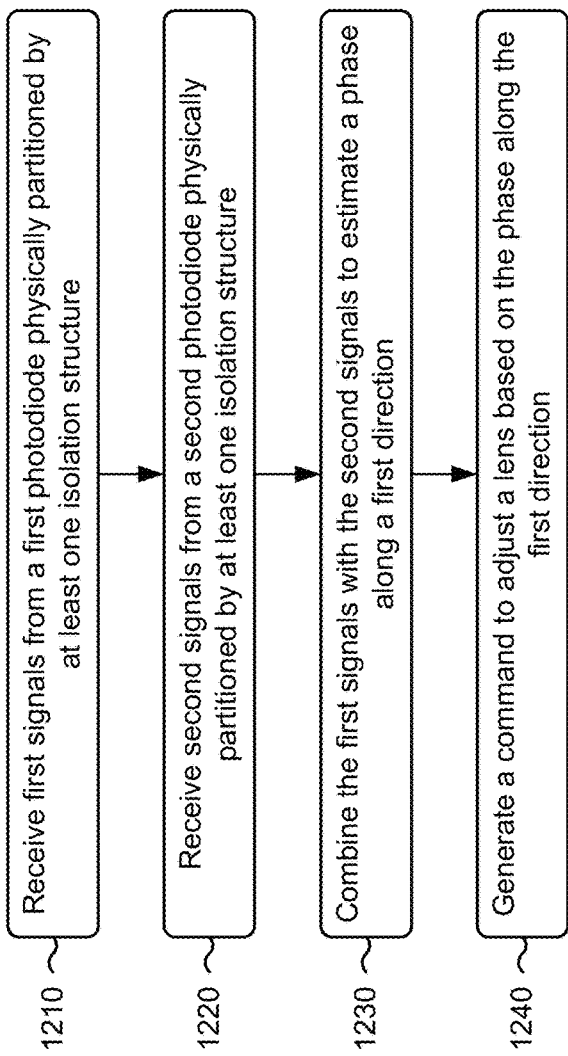

1210 — Receive first signals from a first photodiode physically partitioned by at least one isolation structure 1220 — Receive second signals from a second photodiode physically partitioned by at least one isolation structure 1230 — Combine the first signals with the second signals to estimate a phase along a first direction 1240 — Generate a command to adjust a lens based on the phase along the first direction

STRUCTURES AND METHODS FOR PHASE DETECTION AUTO FOCUS

BACKGROUND

A complementary metal oxide semiconductor (CMOS) image sensor may include a plurality of pixel sensors. A pixel sensor of the CMOS image sensor may include a transfer transistor, which may include a photodiode configured to convert photons of incident light into a photocurrent of electrons and a transfer gate configured to control the flow of the photocurrent between the photodiode and a drain region. The drain region may be configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 is a flowchart of an example process associated with using a semiconductor structure described herein.

DETAILED DESCRIPTION

Figure 1:
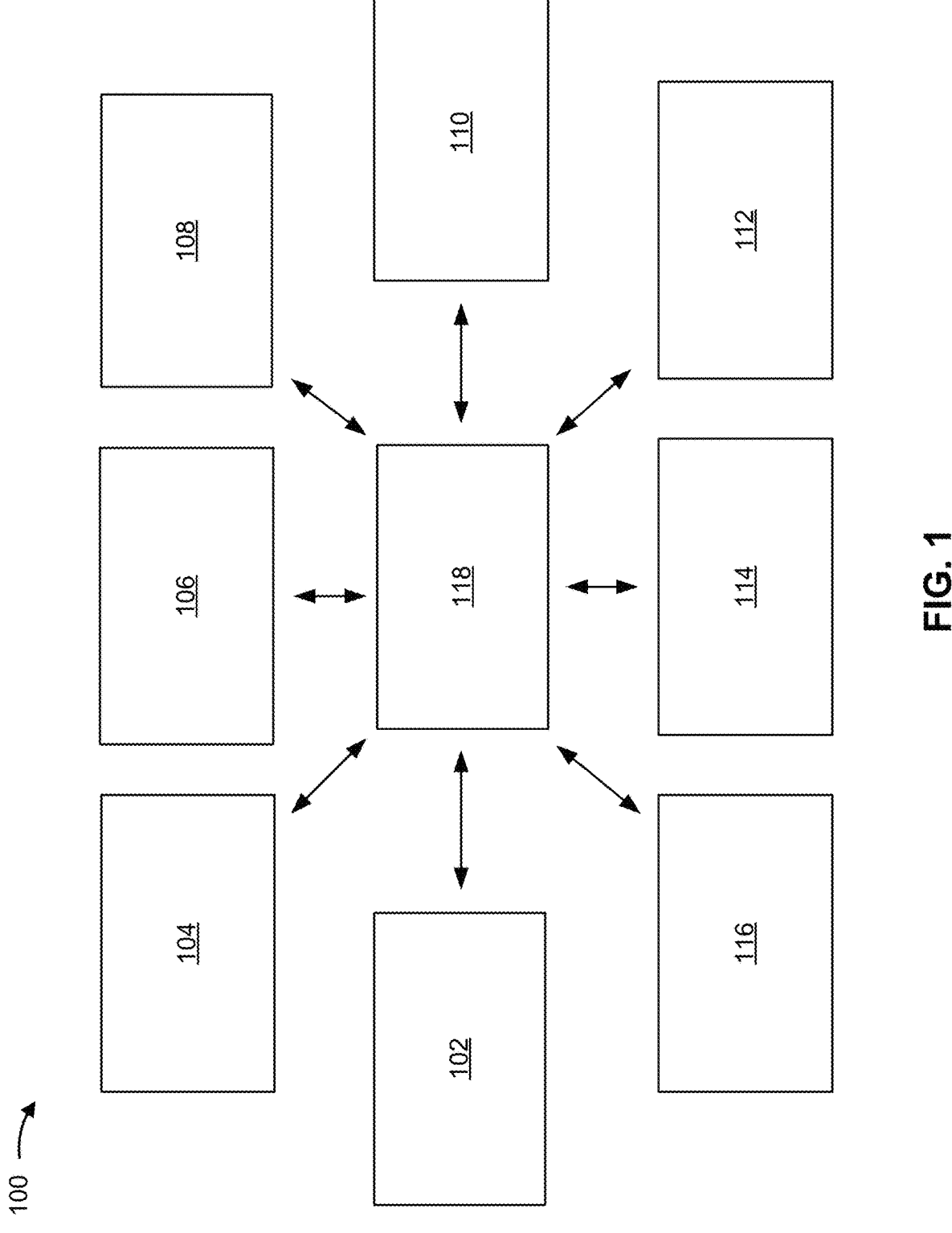
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor device (e.g., a complementary metal oxide semiconductor (CMOS) image sensor device or another type of image sensor device) is a type of electronic semiconductor device that uses pixel sensors to generate a photocurrent based on light received at the pixel sensors. The magnitude of the photocurrent may be based on the intensity of the light, based on the wavelength of the light, and/or based on another attribute of the light. The photocurrent is then processed to generate an electronic image, an electronic video, and/or another type of electronic signal.

Typically, a camera device that includes an image sensor device may also include a separate phase detector auto focus (PDAF) device. A portion of incident light that is received through a lens of the camera device is directed to the PDAF device for the purpose of performing autofocus functions of the camera device to focus a field of view onto the image sensor device. Generally, the PDAF device combines signals from pixels in different locations in an array in order to determine a focus position for a lens of the image sensor device. This process generally uses signals from a large quantity of pixels and multiple calculations to estimate a phase difference across those pixels.

Some implementations described herein provide techniques and apparatuses for forming an in-pixel separation structure that divides a photodiode of a pixel into multiple regions. The in-pixel separation structure may be a shallow deep trench isolation (DTI) structure. Alternatively, a high absorption (HA) structure formed in a line may function as the in-pixel separation structure. Each pixel may be divided in half or into thirds by one or more in-pixel separation structures. As a result, a lens of an image sensor device may be focused by using combining signals associated with different portions of photodiodes. Because the phase difference is determinable using only a few photodiodes that are physically partitioned, the lens may be focused faster and with fewer pixels, which conserves power, processing resources, and raw materials.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, a photoresist removal tool 114, an annealing tool 116, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, an epitaxy tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The photoresist removal tool 114 is a semiconductor processing tool that is capable of removing remaining portions of a photoresist layer from a substrate after the etch tool 108 removes portions of the substrate. For example, the photoresist removal tool 114 may use a chemical stripper and/or another technique to remove a photoresist layer from a substrate.

The annealing tool 116 is a semiconductor processing tool that includes a semiconductor processing chamber and one or more devices capable of heating a semiconductor substrate or semiconductor device. For example, the annealing tool 116 may include a rapid thermal annealing (RTA) tool or another type of annealing tool that is capable of heating a semiconductor substrate to cause a reaction between two or more materials or gasses, to cause a material to decompose. As another example, the annealing tool 116 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 116 may be configured to heat (e.g., raise or elevate the temperature of) a layer (or portions thereof) to enable bonding of two or more semiconductor devices.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form a plurality of photodiodes in a substrate; form a DTI structure at least partially surrounding the plurality of photodiodes; and/or form, in at least one photodiode of the plurality of photodiodes, at least one isolation structure configured to separate light, entering the at least one photodiode, by phase, among other examples.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
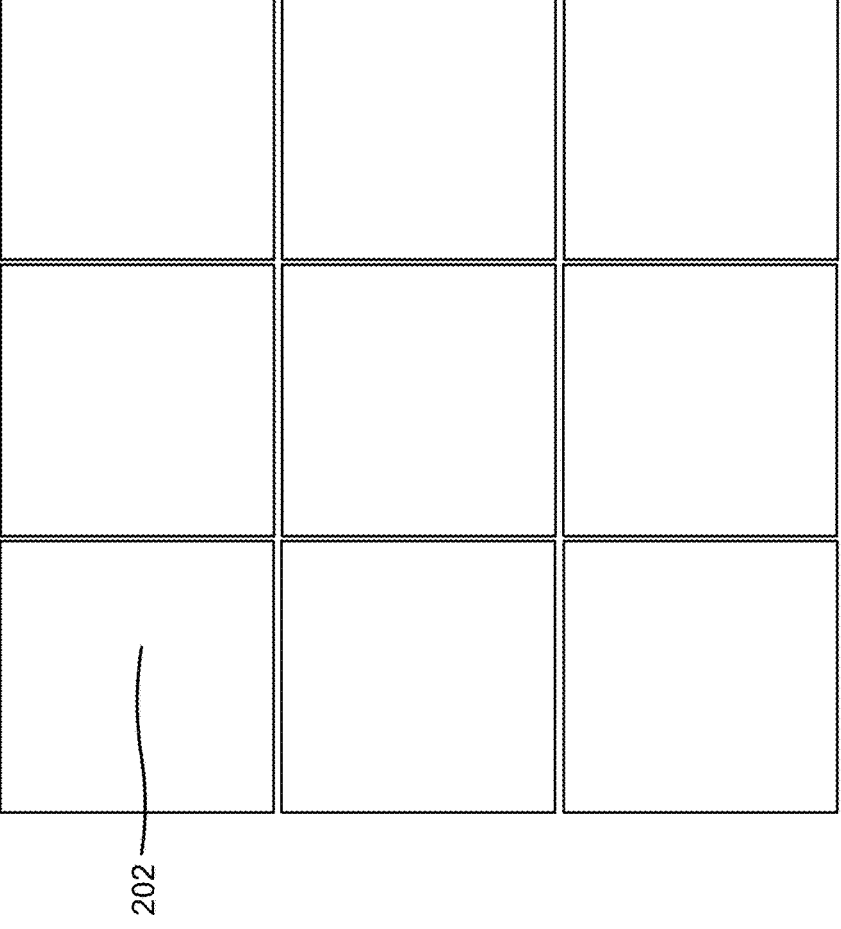
FIG. 2 is a diagram of an example pixel array described herein.

FIG. 2 is a diagram of an example pixel array 200 (or a portion thereof) described herein. The pixel array 200 may be included in an image sensor, such as a CMOS image sensor, a BSI CMOS image sensor, or another type of image sensor.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

FIGS. 3A-3G are diagrams of example pixel sensors described herein. Each pixel sensor includes at least one isolation structure that physically partitions a photodiode of the pixel sensor. The isolation structure separates incoming light by phase such that output from the photodiode is based on including photons with phases that interact constructively with the isolation structure and excluding photons with phases that interact destructively with the isolation structure.

Figure 3A:
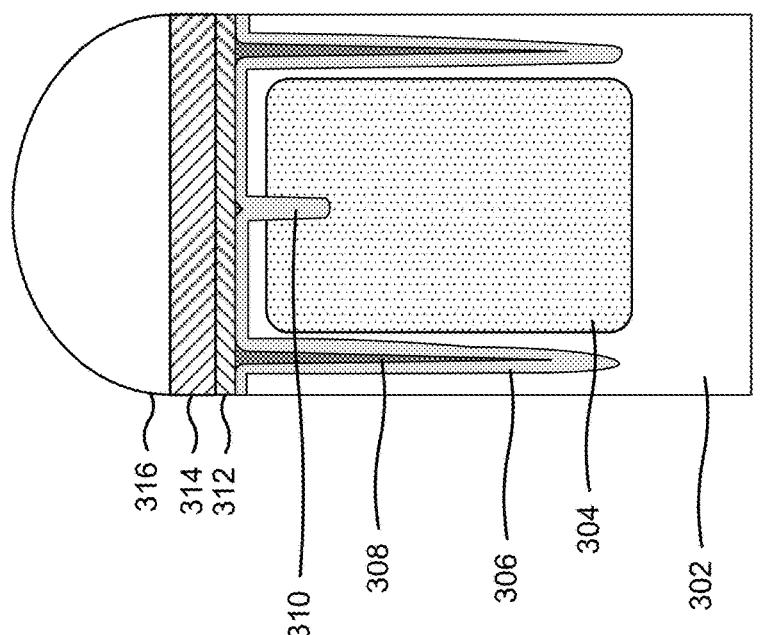
FIGS. 3A-3G are diagrams of example pixel sensors described herein.

FIG. 3A illustrates a cross-section view of a pixel sensor 300. In some implementations, the pixel sensor 300 may be included in the pixel array 200 (or a portion thereof). In some implementations, the pixel sensor 300 may be included in an image sensor. The image sensor may be a CMOS image sensor, a backside illuminated (BSI) CMOS image sensor, or another type of image sensor.

As shown in FIG. 3A, the pixel sensor 300 may include a substrate 302. The substrate 302 may include a semiconductor die substrate, a semiconductor wafer, or another type of substrate in which semiconductor pixels may be formed. In some implementations, the substrate 302 is formed of silicon (Si), a material including silicon, a III-V compound semiconductor material such as gallium arsenide (GaAs), a silicon on insulator (SOI), or another type of semiconductor material that is capable of generating a charge from photons of incident light. In some implementations, the substrate 302 is formed of a doped material (e.g., a p-doped material or an n-doped material) such as a doped silicon.

The pixel sensor 300 may include a photodiode 304 included in the substrate 302 (e.g., below a top surface of the substrate 302). The photodiode 304 may include a region of the substrate 302 that is doped with a plurality of types of ions to form a p-n junction or a PIN junction (e.g., a junction between a p-type portion, an intrinsic (or undoped) type portion, and an n-type portion). For example, the substrate 302 may be doped with an n-type dopant to form a first portion (e.g., an n-type portion) of the photodiode 304 and a p-type dopant to form a second portion (e.g., a p-type portion) of the photodiode 304. The photodiode 304 may be configured to absorb photons of incident light. The absorption of photons causes the photodiode 304 to accumulate a charge (referred to as a photocurrent) due to the photoelectric effect. Here, photons bombard the photodiode 304, which causes emission of electrons of the photodiode 304. The emission of electrons causes the formation of electron-hole pairs, where the electrons migrate toward a cathode of the photodiode 304, and the holes migrate toward an anode, which produces the photocurrent.

A DTI structure 308 may be included in the substrate 302 and at least partially surround the photodiode 304. The DTI structure 308 may provide optical isolation by blocking or preventing diffusion or bleeding of light from the photodiode 304 to a neighboring photodiode, thereby reducing crosstalk between adjacent pixel sensors. As further shown in FIG. 3A, the DTI structure 308 may include trenches that are coated or lined with lining layer 306 (e.g., an antireflective coating (ARC)) and filled with a dielectric layer (e.g., over the lining layer 306). The DTI structure 308 may be formed in a grid layout in which the DTI structure 308 extends around perimeters of pixel sensors in a pixel array (including the pixel sensor 300) and intersects at various locations of the pixel array. In some implementations, the DTI structure 308 is formed in a backside of the substrate 302 to provide optical isolation between pixel sensors, and thus may be referred to as a backside DTI (BDTI) structure.

The dielectric layer filling the DTI structure 308 may include an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another dielectric material that is capable of providing optical isolation between pixel sensors. The lining layer 306 may be included within the DTI structure 308 and on the substrate 302 above the photodiode 304. The lining layer 306 may include a suitable material for reducing a reflection of incident light projected toward the photodiode 304. For example, the lining layer 306 may include nitrogen-containing material.

The pixel sensor 300 may include at least one isolation structure 310 (e.g., a single isolation structure 310 in FIG. 3A) in the photodiode 304. The isolation structure 310 is located within a perimeter (or inner boundary) of the DTI structure 308 and is generally physically smaller than the DTI structure 308. For example, the isolation structure 310 may have a width at a top surface of the substrate 302 that is smaller than a width of the DTI structure 308 at the top surface of the substrate 302. For example, the isolation structure 310 may have a width in a range from approximately 0.2 micrometers ($\mu$m) to approximately 1.0 $\mu$m. Selecting a width of at least 0.2 $\mu$m enables the isolation structure 310 to separate incoming light by phase. Selecting a width of no more than 1.0 $\mu$m reduces a blocking effect on the photodiode 304 (e.g., reducing incoming photons such that sensitivity of the photodiode 304 is reduced). Similarly, the isolation structure 310 may have a width at a bottom of the isolation structure 310 that is smaller than a width of the DTI structure 308 at a bottom of the DTI structure 308. Additionally, the isolation structure 310 may have a depth into the substrate 302 that is smaller than a depth of the DTI structure 308 into the substrate 302.

Figure 6F:
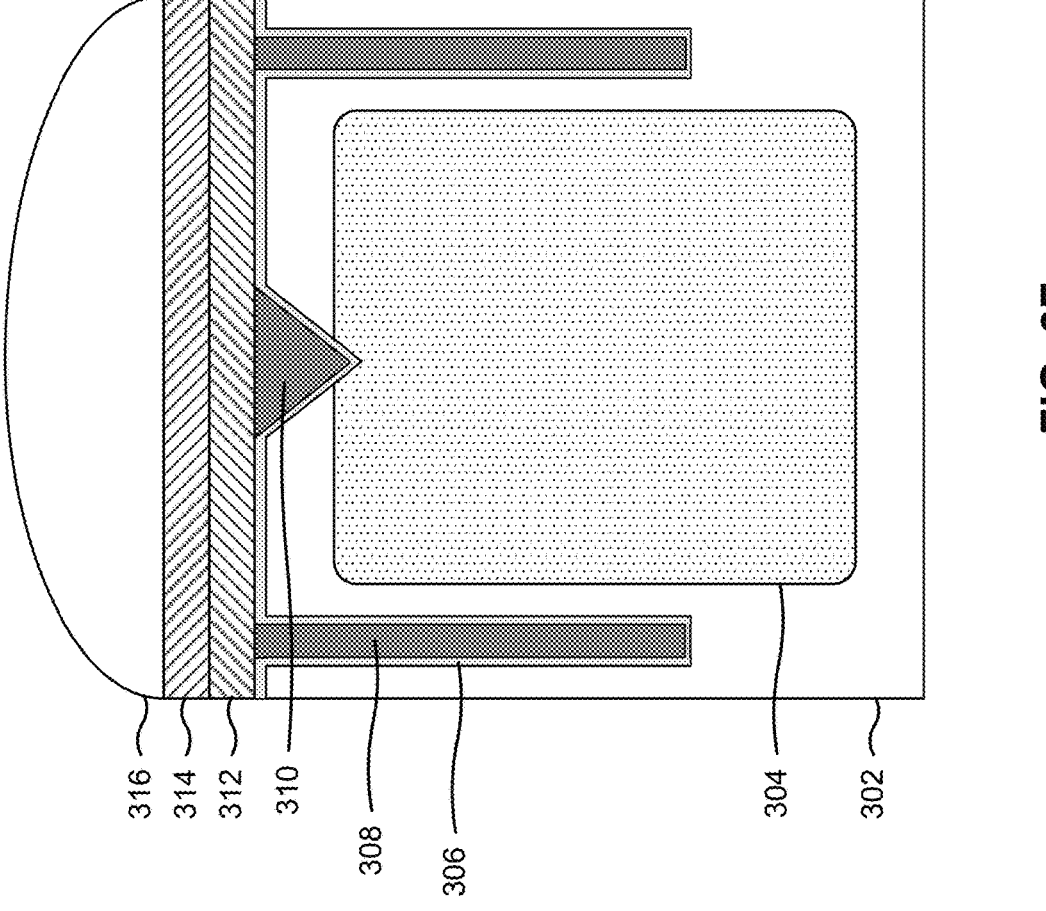

As described in connection with FIG. 3B, the isolation structure 310 may include a shallow DTI structure. As described in connection with FIG. 3C, the isolation structure 310 may include a plurality of high absorption (HA) structures. Each HA structure may include a structure having angled walls such that the structure has an approximately pyramidal shape (e.g., exhibiting an approximately triangular shape in a cross-sectional view, as shown in FIG. 6F, FIG. 7G, and FIG. 8G, and an approximately polygonal shape in a top-down view, such as an approximately rectangular shape, as shown in FIG. 3C, or an approximately triangular shape). As used herein, "pyramidal shape" refers to a structure with a polygonal base connected to a point or to a smaller polygon that functions as an apex.

The isolation structure 310 may additionally be coated or lined with a lining layer. In some implementations, the lining layer of the isolation structure 310 incudes a same material as the lining layer 306 that coats or lines the DTI structure 308. In some implementations, the lining layer of the isolation structure 310 includes a different material than the lining layer 306 that coats or lines the DTI structure 308. Furthermore, the isolation structure 310 may be filled with a dielectric layer (e.g., over the lining layer 306). In some implementations, the dielectric layer of the isolation structure 310 incudes a same material as the dielectric layer filling the DTI structure 308. In some implementations, the dielectric layer of the isolation structure 310 includes a different material than the dielectric layer filling the DTI structure 308.

As further shown in FIG. 3A, a buffer layer 312 may be included over and/or on the top surface of the substrate 302. The buffer layer 312 may include a dielectric material to provide protection for the layers beneath the buffer layer 312 from the layers and structures that are formed above the buffer layer 312. Therefore, the buffer layer 312 may include an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another dielectric material that is capable of providing protection.

A color filter layer 314 may be included above and/or on the buffer layer 312. In some implementations, the color filter layer 314 includes a visible light color filter configured to filter a particular wavelength or a particular wavelength range of visible light (e.g., red light, blue light, or green light). In some implementations, the color filter layer 314 includes a near infrared (NIR) filter (e.g., a NIR bandpass filter) configured to permit wavelengths associated with NIR light to pass through the color filter layer 314 and to block other wavelengths of light. In some implementations, the color filter layer 314 includes a NIR cut filter configured to block NIR light from passing through the color filter layer 314. In some implementations, the color filter layer 314 is omitted from the pixel sensor 300 to permit all wavelengths of light to pass through to the photodiode 304. In these examples, the pixel sensor 300 may be configured as a white pixel sensor.

A micro-lens layer 316 may be included above and/or on the color filter layer 314. The micro-lens layer 316 may include a micro-lens for the pixel sensor 300 configured to focus incident light toward the photodiode 304 and/or to reduce optical crosstalk between the pixel sensor 300 and adjacent pixel sensors.

Because the photodiode 304 is divided by the isolation structure 310, signals from the photodiode 304 may be combined with signals from similar photodiodes to determine a horizontal phase and/or a vertical phase of incoming light, as described in connection with FIG. 4B. As a result, the micro-lens layer 316 and/or a larger lens included in the image sensor with the pixel sensor 300 may be focused using the signals from the photodiode 304. Using signals from photodiodes that are physically partitioned is faster and less computationally intensive than other PDAF techniques.

Figure 3B:
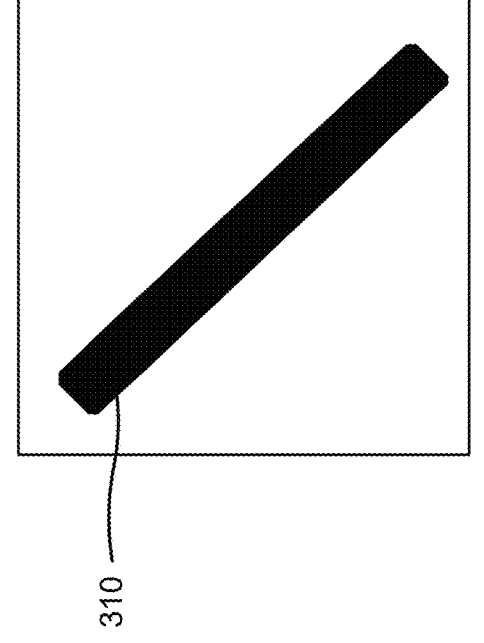
Figure 3C:
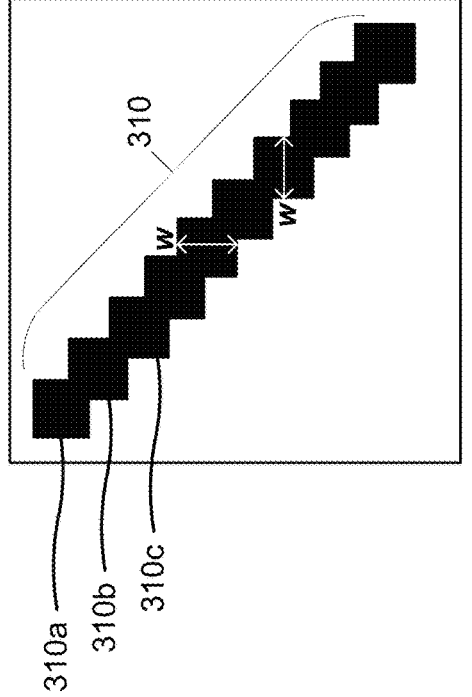

FIG. 3B illustrates a top down view of a pixel sensor 320. The pixel sensor 320 is similar to pixel sensor 300 and includes an isolation structure 310 that divides a photodiode (not shown) of the pixel sensor 320. As shown in FIG. 3B, the isolation structure 310 includes a shallow DTI that extends from a top left corner of the pixel sensor 320 to a bottom right corner of the pixel sensor 320. Therefore, the isolation structure 310 divides the photodiode of the pixel sensor 320 approximately in half.

FIG. 3C illustrates a top down view of a pixel sensor 330. The pixel sensor 330 is similar to pixel sensor 300 and includes an isolation structure 310 that divides a photodiode (not shown) of the pixel sensor 330. As shown in FIG. 3C, the isolation structure 310 includes a plurality of HA structures (e.g., HA structure 310a, HA structure 310b, HA structure 310c, and so on) that extend from a top left corner of the pixel sensor 330 to a bottom right corner of the pixel sensor 330. For example, each HA structure may partially overlap an adjacent HA structure on two sides (e.g., two sides forming a top left angle or two sides forming a bottom right angle). Therefore, the isolation structure 310 divides the photodiode of the pixel sensor 330 approximately in half.

As further shown in FIG. 3C, each HA structure may have a cross-section (e.g., in the top-down view) that is approximately square. As used herein, "square" refers to a polygon that has four approximately equal sides (e.g., within 1%, 10%, or a similar margin of error). Accordingly, a width (represented by w in FIG. 3C) of the HA structure (e.g., at a top surface of a substrate (not shown) supporting the pixel sensor 330) may be in a range from approximately 0.2 $\mu$m to approximately 1.0 $\mu$m. Selecting a width of at least 0.2 $\mu$m enables the HA structures to separate incoming light by phase. Selecting a width of no more than 1.0 $\mu$m reduces a blocking effect on the pixel sensor 330 (e.g., reducing incoming photons such that sensitivity of the pixel sensor 330 is reduced).

Figure 3D:
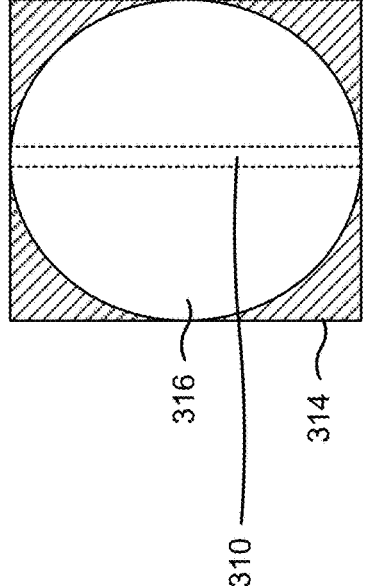
Figure 3E:
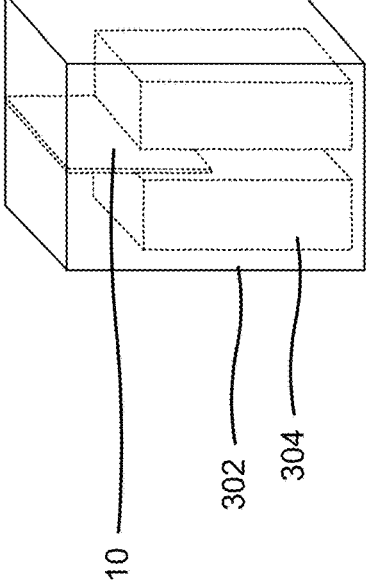

FIG. 3D illustrates a top down view of a pixel sensor 340. The pixel sensor 340 is similar to pixel sensor 300 and includes an isolation structure 310 that divides a photodiode (under the micro-lens layer 316 and the color filter layer 314) of the pixel sensor 340. As shown in FIG. 3D, the isolation structure 310 extends from a top center (approximately) of the pixel sensor 340 to a bottom center (approximately) of the pixel sensor 340. Therefore, the isolation structure 310 divides the photodiode of the pixel sensor 340 approximately in half along a vertical axis. FIG. 3E illustrates a cross-section view of the pixel sensor 340. Thus, FIG. 3E shows the isolation structure 310 physically partitioning the photodiode 304 in the substrate 302.

Figure 3F:
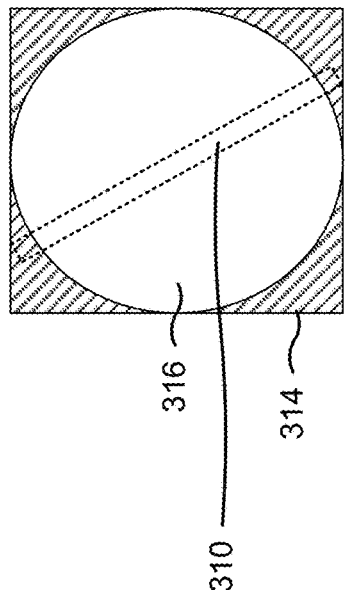
Figure 3F:
Figure 3G:
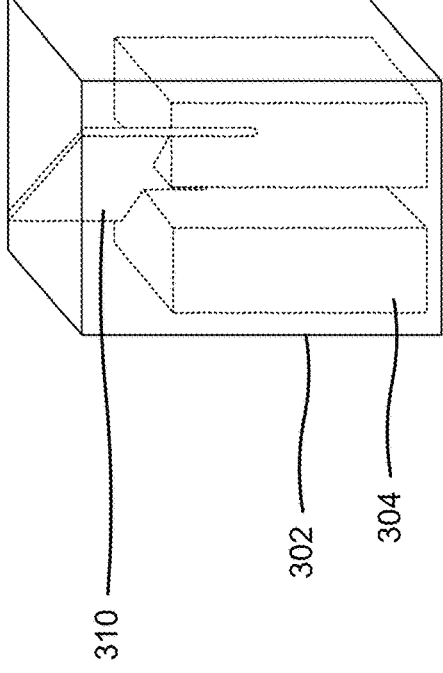

FIG. 3F illustrates a top down view of a pixel sensor 350. The pixel sensor 350 is similar to pixel sensor 300 and includes an isolation structure 310 that divides a photodiode (under the micro-lens layer 316 and the color filter layer 314) of the pixel sensor 350. As shown in FIG. 3F, the isolation structure 310 extends across a surface of the pixel sensor 340 at an angle to a vertical axis. As shown in FIG. 3F, the angle may be greater than 0° but less than 45°, and the isolation structure 310 divides the photodiode of the pixel sensor 350 approximately in half along a vertical axis. FIG. 3G illustrates a cross-section view of the pixel sensor 350. Thus, FIG. 3G shows the isolation structure 310 physically partitioning the photodiode 304 in the substrate 302.

As indicated above, FIGS. 3A-3G are provided as examples. Other examples may differ from what is described with regard to FIGS. 3A-3G.

Figure 4A:
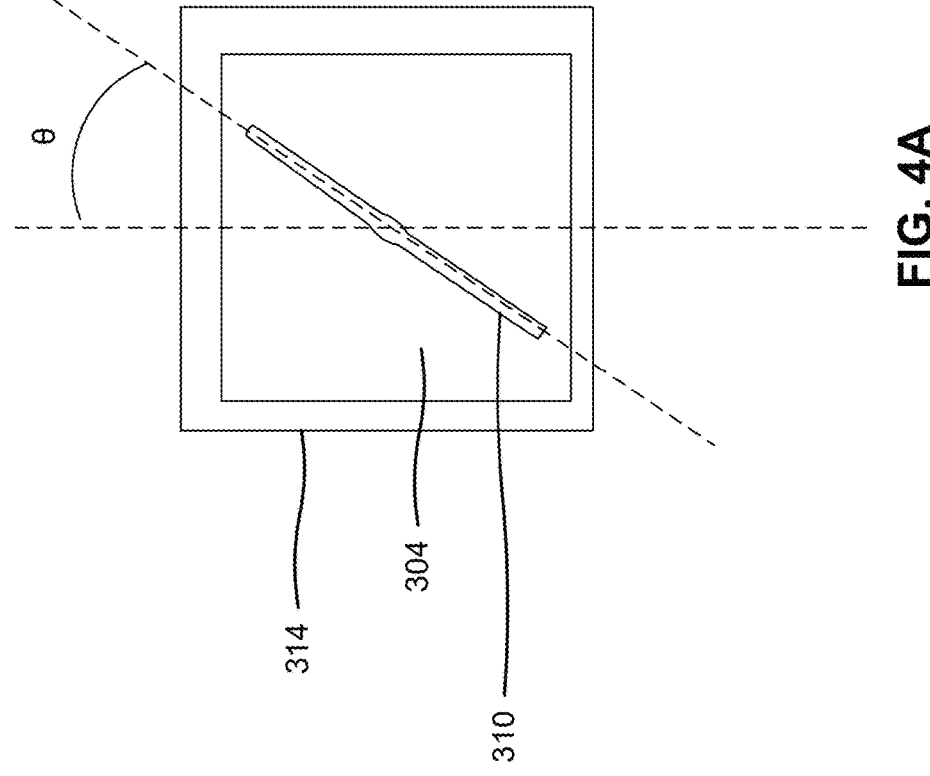
FIGS. 4A-4B are diagrams of example implementations described herein.

FIG. 4A is a diagram of a pixel sensor 400. The pixel sensor 400 includes an isolation structure 310 that physically partitions a photodiode 304 of the pixel sensor 400. The isolation structure 310 separates incoming light by phase such that output from the photodiode 304 is based on including photons with phases that interact constructively with the isolation structure 310 and excluding photons with phases that interact destructively with the isolation structure 310.

As further shown in FIG. 4A, the isolation structure 310 may form an angle (e.g., represented by θ in FIG. 4A) with a vertical axis of the pixel sensor 400. The angle may be in a range from approximately 0° to approximately 75°. This range allows for phase separation around polarizations along the vertical axis. Other implementations may include the isolation structure 310 forming an angle, with a horizontal axis of the pixel sensor 400, in a range from approximately 0° to approximately 75°. This range allows for phase separation around polarizations along the horizontal axis.

Figure 4B:
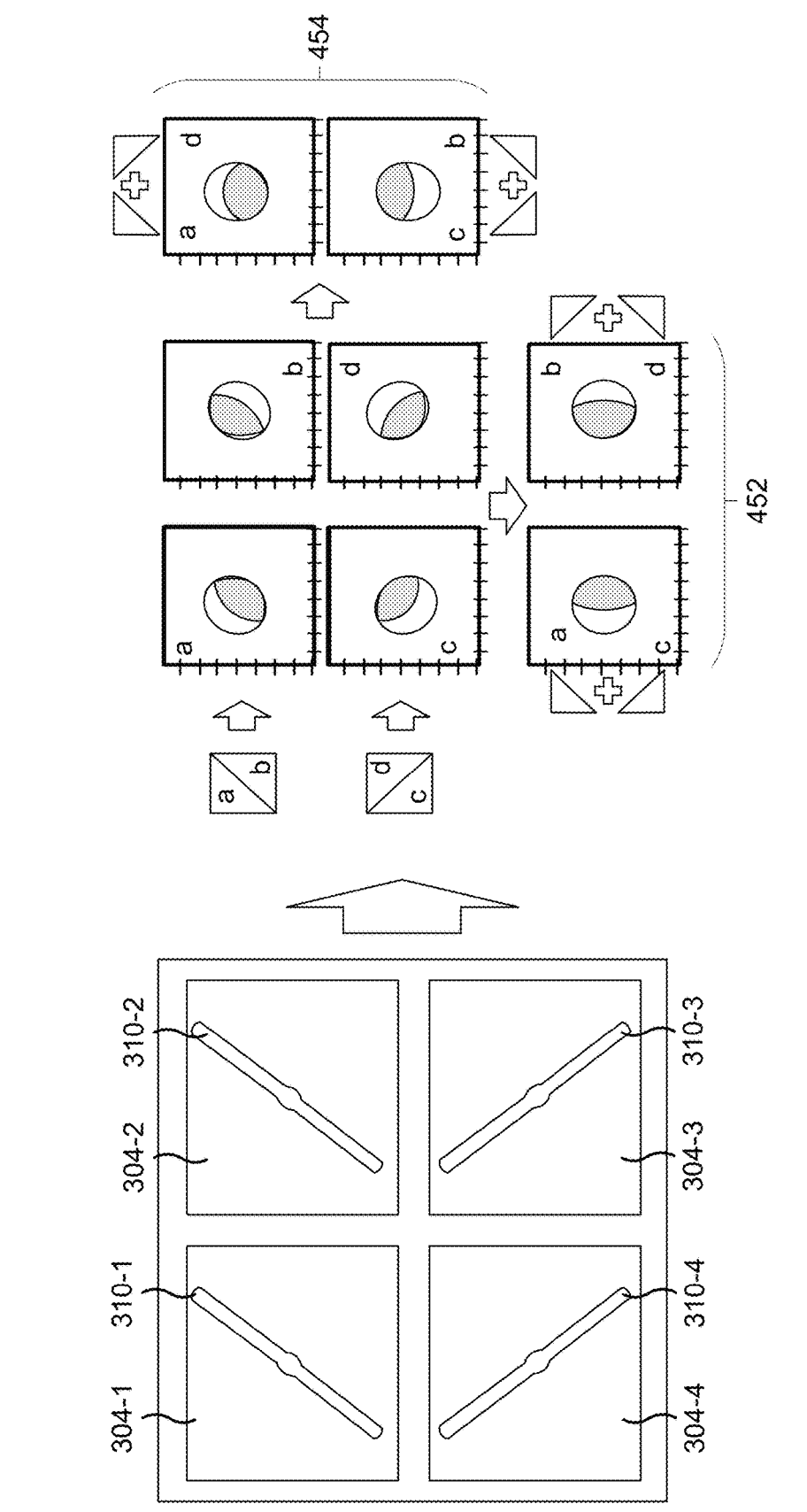

FIG. 4B is a diagram of a top-down view of a pixel array 450. In some implementations, the pixel array 450 may be configured as, or included in, the pixel array 200 (or a portion thereof). In some implementations, the pixel array 450 may be included in an image sensor. The image sensor may be a CMOS image sensor, a BSI CMOS image sensor, or another type of image sensor.

As shown in FIG. 4B, the pixel array 450 includes a plurality of photodiodes (e.g., photodiodes 304-1, 304-2, 304-3, and 304-4 in FIG. 4B), each with a corresponding isolation structure (e.g., isolation structures 310-1, 310-2, 310-3, and 310-4) that divides the photodiode. Some photodiodes are divided with isolation structures forming a positive, acute angle with a vertical axis of the pixel array 450 (e.g., photodiodes 304-1 and 304-2 in FIG. 4B); other photodiodes are divided with isolation structures forming a positive, acute angle with a horizontal axis of the pixel array 450 (e.g., photodiodes 304-3 and 304-4 in FIG. 4B).

As further shown in FIG. 4B, signals from different photodiodes may be combined to estimate phase along a vertical direction or a horizontal direction. As shown by reference number 452, signals from the photodiode 304-1 and/or the photodiode 304-2 may be combined with signals from the photodiode 304-3 and/or the photodiode 304-4 to estimate a phase along a first direction (e.g., a horizontal direction in FIG. 4B). For example, signals associated with top left portions of the photodiode 304-1 and/or the photodiode 304-2 may be combined with signals associated with bottom left portions photodiode 304-3 and/or the photodiode 304-4 to estimate the phase along the first direction. Additionally, or alternatively, signals associated with bottom right portions of the photodiode 304-1 and/or the photodiode 304-2 may be combined with signals associated with top right portions photodiode 304-3 and/or the photodiode 304-4 to estimate the phase along the first direction. Similarly, as shown by reference number 454, signals from the photodiode 304-1 and/or the photodiode 304-2 may be combined with signals from the photodiode 304-3 and/or the photodiode 304-4 to estimate a phase along a second direction perpendicular to the first direction (e.g., a vertical direction in FIG. 4B). For example, signals associated with top left portions of the photodiode 304-1 and/or the photodiode 304-2 may be combined with signals associated with top right portions photodiode 304-3 and/or the photodiode 304-4 to estimate the phase along the second direction. Additionally, or alternatively, signals associated with bottom right portions of the photodiode 304-1 and/or the photodiode 304-2 may be combined with signals associated with bottom left portions photodiode 304-3 and/or the photodiode 304-4 to estimate the phase along the second direction. Thus, a lens associated with the pixel array 450 (e.g., micro-lens layers as described herein and/or a larger lens covering multiple pixels of the pixel array 450) may be adjusted based on the estimated phase(s). For example, a controller (e.g., processor) associated with the pixel array 450 may generate (and transmit) a command to adjust the lens to reduce disparities across signals associated with different portions of the photodiodes 304-1, 304-2, 304-3, and 304-4. As a result, the lens is adjusted faster and with less power and processing resources than using other PDAF techniques.

In some implementations, the adjustment described above may be performed iteratively. For example, after generating (and transmitting) the command to adjust the lens, the controller may receive combined updated signals from the photodiodes to estimate an updated phase. The controller may thus generate (and transmit) an additional command to adjust the lens based on the updated phase. This process may continue until the estimated phase satisfies a threshold (e.g., until a disparity across signals associated with different portions of the photodiodes 304-1, 304-2, 304-3, and 304-4 satisfies a threshold).

As indicated above, FIGS. 4A-4B are provided as examples. Other examples may differ from what is described with regard to FIGS. 4A-4B.

Figure 5A:
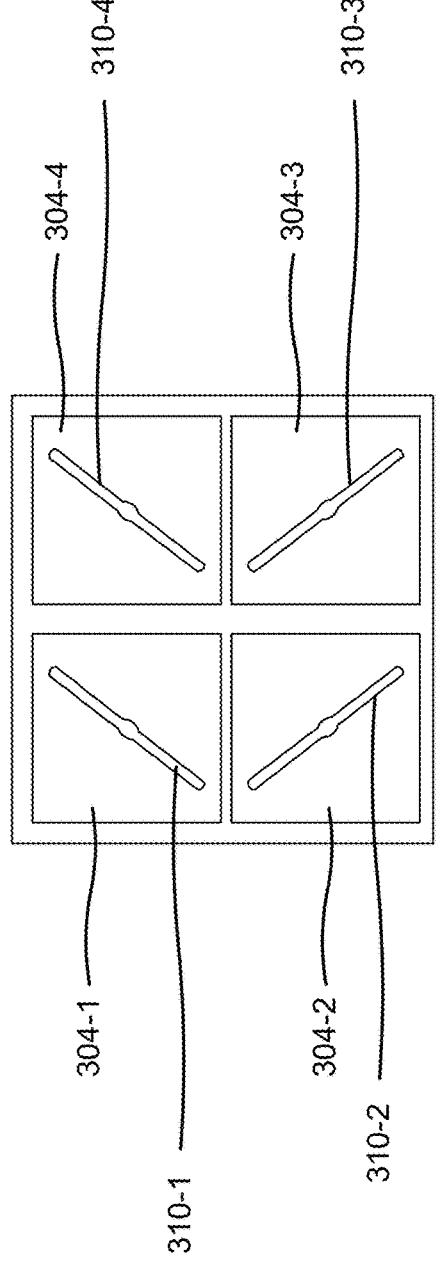
FIGS. 5A-5H are diagrams of example pixel arrays described herein.

FIGS. 5A-5H are diagrams of example pixel arrays described herein. FIG. 5A illustrates a top-down view of a pixel array 500. In some implementations, the pixel array 500 may be configured as, or included in, the pixel array 200 (or a portion thereof). In some implementations, the pixel array 500 may be included in an image sensor. The image sensor may be a CMOS image sensor, a BSI CMOS image sensor, or another type of image sensor.

As shown in FIG. 5A, the pixel array 500 includes a plurality of photodiodes (e.g., photodiodes 304-1, 304-2, 304-3, and 304-4 in FIG. 5A), each with a corresponding isolation structure (e.g., isolation structures 310-1, 310-2, 310-3, and 310-4) that divides the photodiode. Photodiodes within one row are divided with isolation structures forming a positive, acute angle with a vertical axis of the pixel array 500 (e.g., photodiodes 304-1 and 304-4 in FIG. 5A); photodiodes within another row are divided with isolation structures forming a positive, acute angle with a horizontal axis of the pixel array 500 (e.g., photodiodes 304-2 and 304-3 in FIG. 5A).

Figure 5B:
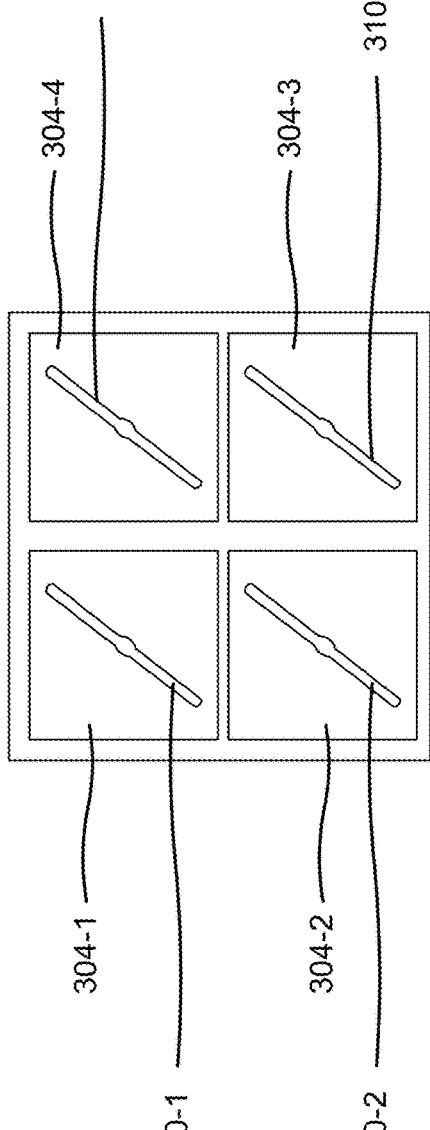
Figure 5C:
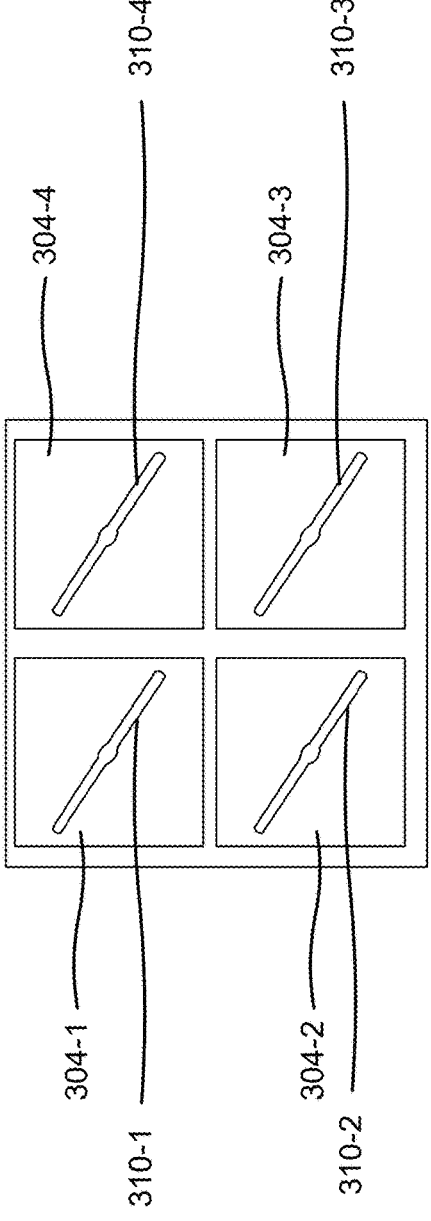

FIG. 5B illustrates a top-down view of a pixel array 510. The pixel array 510 is similar to the pixel array 500 except that all photodiodes are divided with isolation structures forming a positive, acute angle with a vertical axis of the pixel array 510. FIG. 5C illustrates a top-down view of a pixel array 520. The pixel array 520 is similar to the pixel array 500 except that all photodiodes are divided with isolation structures forming a positive, acute angle with a horizontal axis of the pixel array 520.

Figure 5D:
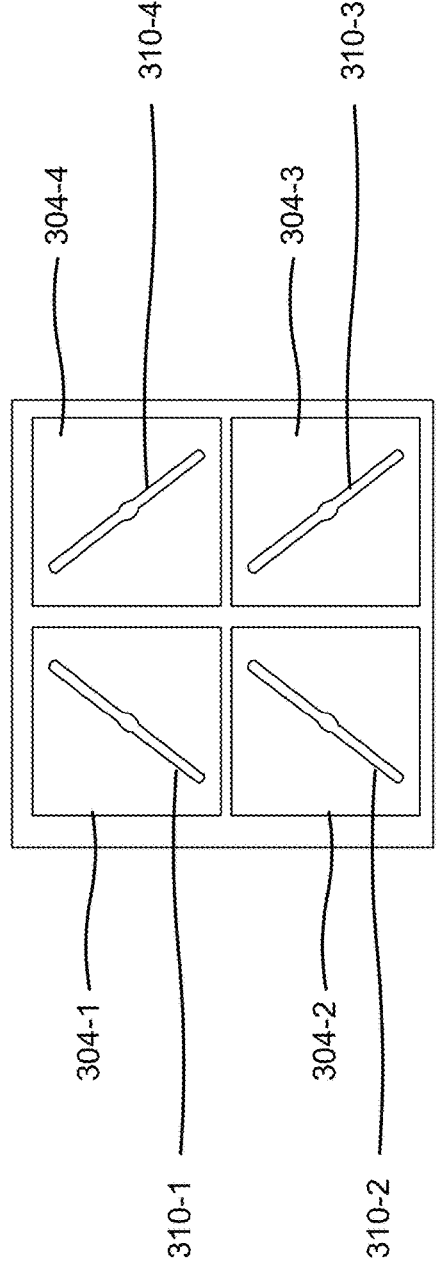

FIG. 5D illustrates a top-down view of a pixel array 530. The pixel array 530 is similar to the pixel array 500 except that photodiodes within one column are divided with isolation structures forming a positive, acute angle with a vertical axis of the pixel array 530 (e.g., photodiodes 304-1 and 304-2 in FIG. 5D), and photodiodes within another column are divided with isolation structures forming a positive, acute angle with a horizontal axis of the pixel array 530 (e.g., photodiodes 304-3 and 304-4 in FIG. 5D).

Figure 5E:
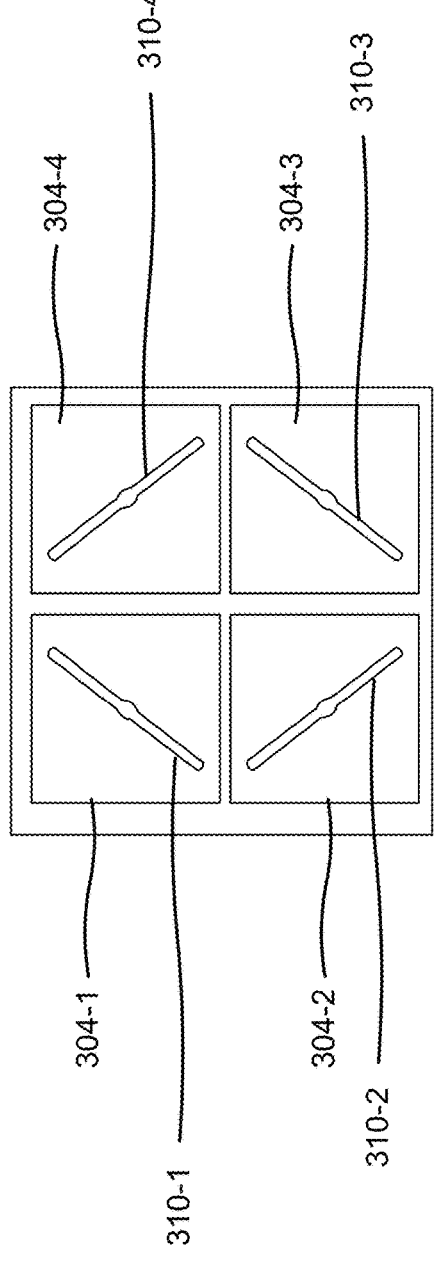

FIG. 5E illustrates a top-down view of a pixel array 540. The pixel array 540 is similar to the pixel array 500 except that photodiodes along one diagonal are divided with isolation structures forming a positive, acute angle with a vertical axis of the pixel array 500 (e.g., photodiodes 304-1 and 304-3 in FIG. 5E), and photodiodes within another column are divided with isolation structures forming a positive, acute angle with a horizontal axis of the pixel array 500 (e.g., photodiodes 304-2 and 304-4 in FIG. 5E).

Figure 5F:
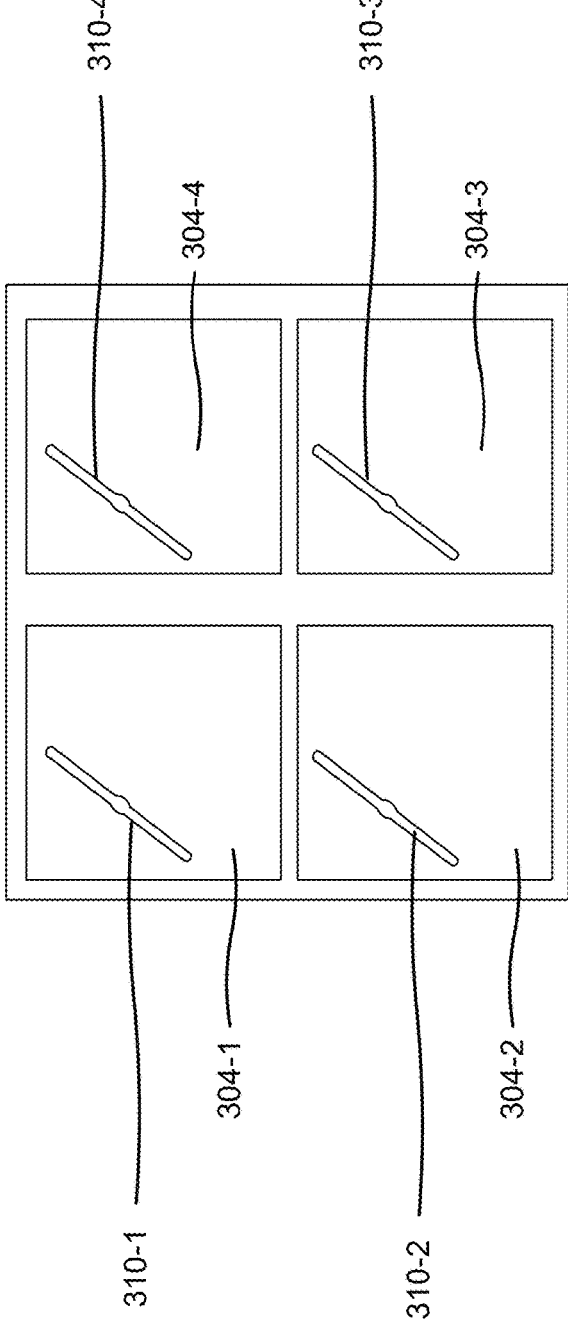

FIG. 5F illustrates a top-down view of a pixel array 550. The pixel array 550 is similar to the pixel array 520 except that the isolation structures divide the photodiodes approximately into one-third and two-thirds. For example, each isolation structure may divide the photodiode into a top first portion (e.g., in a range from approximately 30% to approximately 40% of a total surface area of a top surface of the photodiode) and a bottom second portion (e.g., in a range from approximately 60% to approximately 70% of the total surface area of the top surface of the photodiode).

Figure 5G:
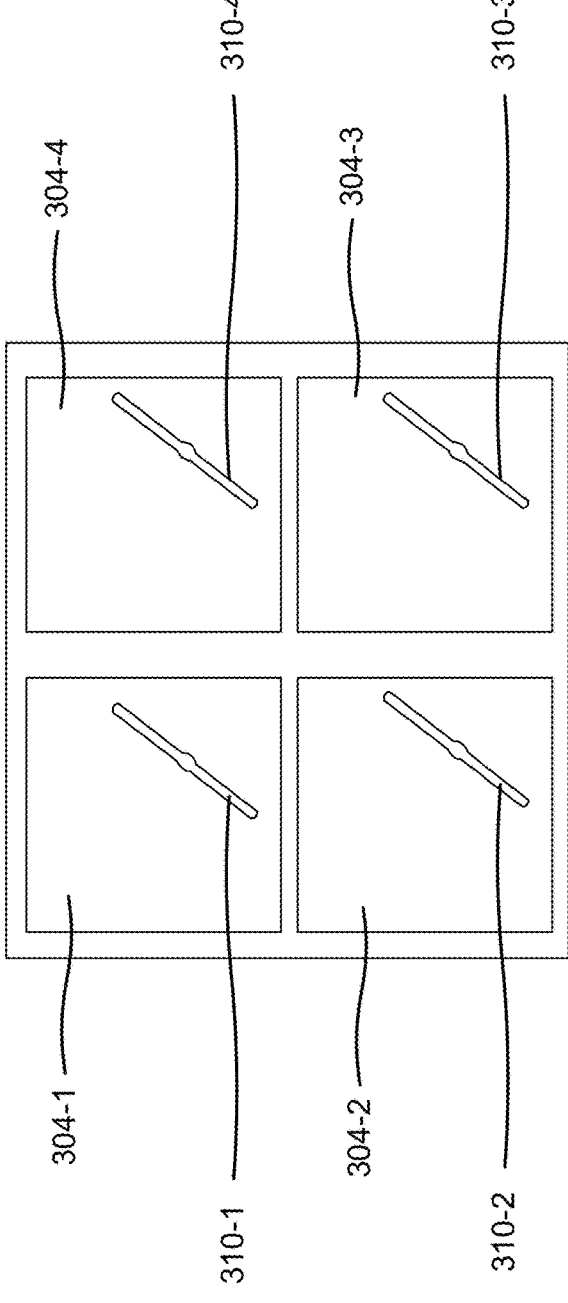

FIG. 5G illustrates a top-down view of a pixel array 560. The pixel array 560 is similar to the pixel array 550 except that the isolation structures divide the photodiodes approximately into two-thirds and one-thirds. For example, each isolation structure may divide the photodiode into a top first portion (e.g., in a range from approximately 60% to approximately 70% of a total surface area of a top surface of the photodiode) and a bottom second portion (e.g., in a range from approximately 30% to approximately 40% of the total surface area of the top surface of the photodiode).

Figure 5H:
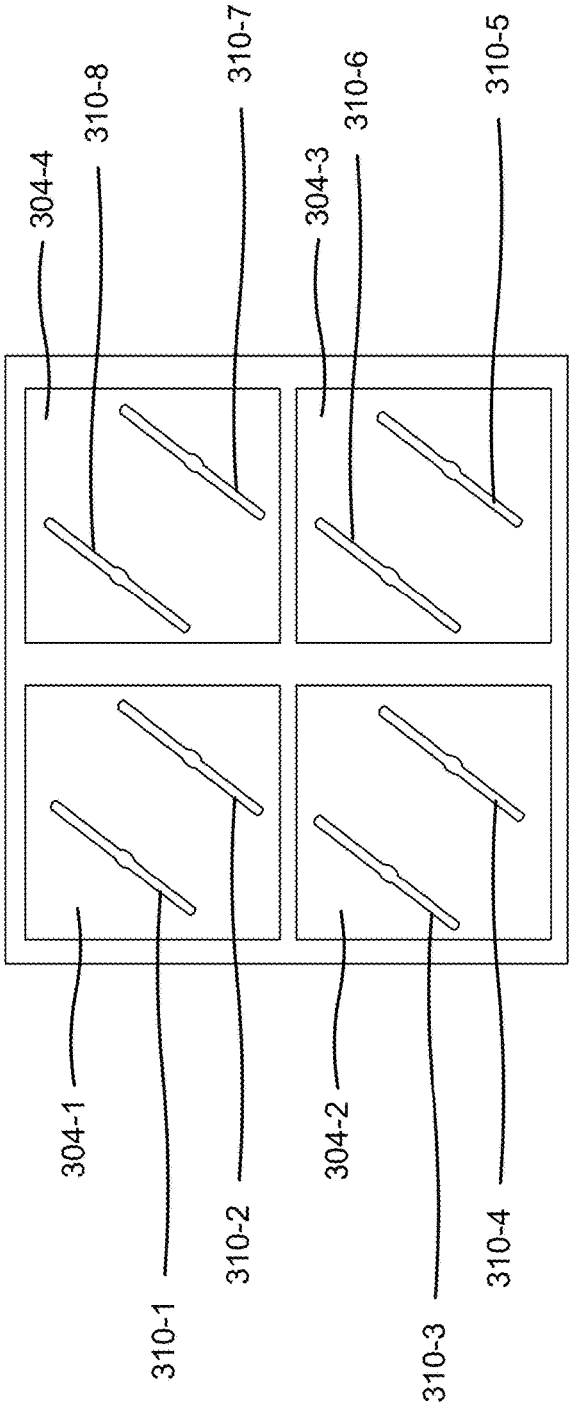

FIG. 5H illustrates a top-down view of a pixel array 570. As shown in FIG. 5H, the pixel array 570 includes a plurality of photodiodes (e.g., photodiodes 304-1, 304-2, 304-3, and 304-4 in FIG. 5H), each with two corresponding isolation structures (e.g., isolation structures 310-1 and 310-2 for the photodiode 304-1, isolation structures 310-3 and 310-4 for the photodiode 304-2, isolation structures 310-5 and 310-6 for the photodiode 304-3, and isolation structures 310-7 and 310-8 for the photodiode 304-4) that divide the photodiode.

Each pair of isolation structures may divide the photodiode into thirds. For example, each photodiode may include two isolation structures that divide the photodiode into a first portion in a range from approximately 30% to approximately 40% of a total surface area of a top surface of the photodiode, a second portion in a range from approximately 30% to approximately 40% of the total surface area of the top surface of the photodiode, and a third portion in a range from approximately 30% to approximately 40% of the total surface area of the top surface of the photodiode.

The pixel arrays described above may be used to adjust a lens, as described in connection with FIG. 4B. A controller (e.g., processor) associated with a pixel array may estimate a phase and perform adjustment based on the estimated phase. The controller combining signals from the photodiodes, as described in connection with FIG. 4B, where the signals associated with different portions of the photodiodes are determined based on a data structure indicating a pattern of isolation structures in the photodiodes. The pixels arrays described above may be selected as a design choice. In some implementations, a pixel array may include multiple isolation structures with different orientations in a single array (e.g., an array with a first portion as described in connection with FIG. 5A in combination with a second portion as described in connection with FIG. 5B, among other examples).

As indicated above, FIGS. 5A-5H are provided as examples. Other examples may differ from what is described with regard to FIGS. 5A-5H.

FIGS. 6A-6F are diagrams of an example implementation 600 described herein. Example implementation 600 may be an example process for forming the pixel sensor 300 having an isolation structure that physically partitions the photodiode. The pixel sensor formed using example implementation 600 may be included in a CMOS image sensor, a BSI CMOS image sensor, or another type of image sensor.

Figure 6A:
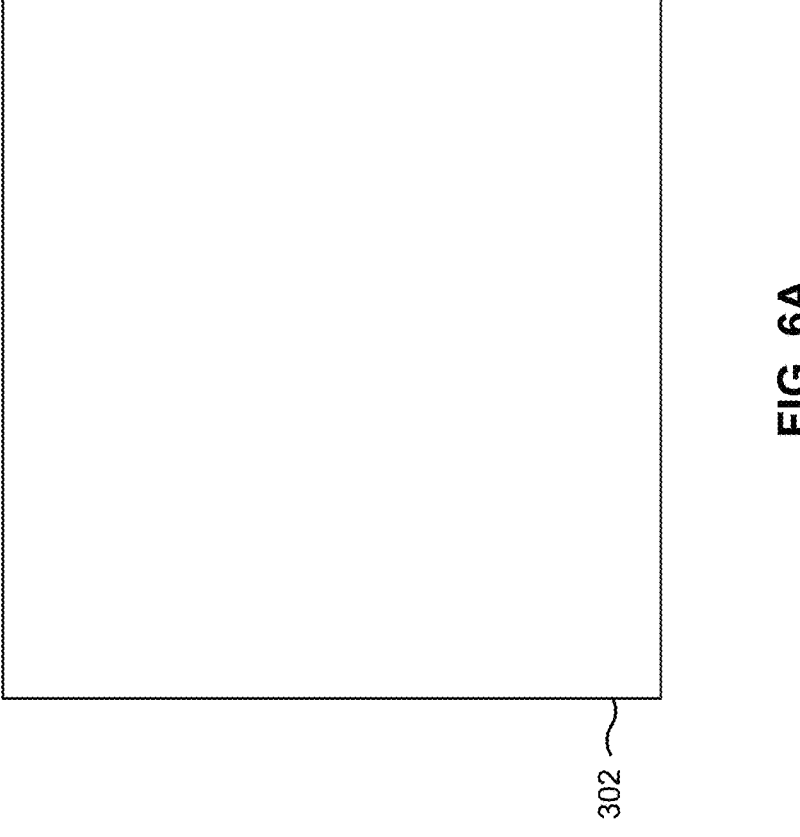
FIGS. 6A-6F are diagrams of an example implementation described herein.

As shown in FIG. 6A, the example process for forming the pixel sensor may be performed in connection with a substrate 302. As described above, the substrate 302 may include a semiconductor die substrate, a semiconductor wafer, a stacked semiconductor wafer, or another type of substrate in which semiconductor pixels may be formed. For example, the substrate 302 may be formed of silicon (Si) (e.g., a silicon substrate), a material including silicon, a III-V compound semiconductor material such as gallium arsenide (GaAs), an SOI, or another type of semiconductor material that is capable of generating a charge from photons of incident light. In some implementations, the substrate 302 is formed of a doped material (e.g., a p-doped material or an n-doped material) such as a doped silicon.

Figure 6B:
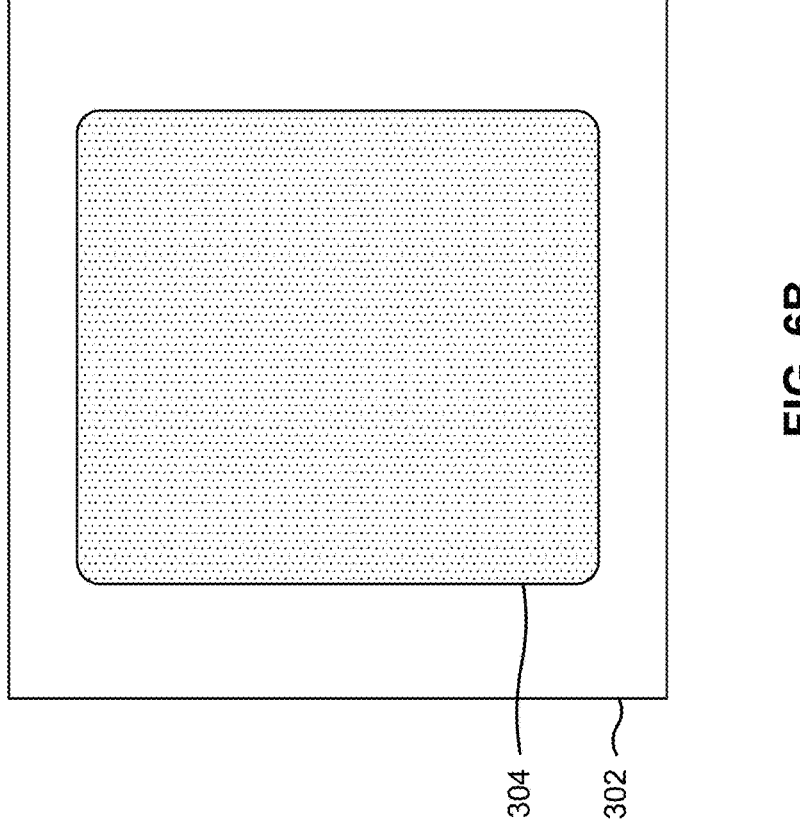

As shown in FIG. 6B, a photodiode 304 may be formed in the substrate 302. For example, an ion implantation tool may dope one or more portions of the substrate 302, using an ion implantation technique, to form n-type regions and/or p-type regions of the photodiode 304 to form a p-n junction for the photodiode 304. For example, the ion implantation tool may dope the substrate 302 with an n-type dopant to form an n-type region, and may dope the substrate 302 with a p-type dopant to form a p-type portion of the p-n junction. In some implementations, another technique is used to form the photodiode 304, such as diffusion.

Figure 6C:
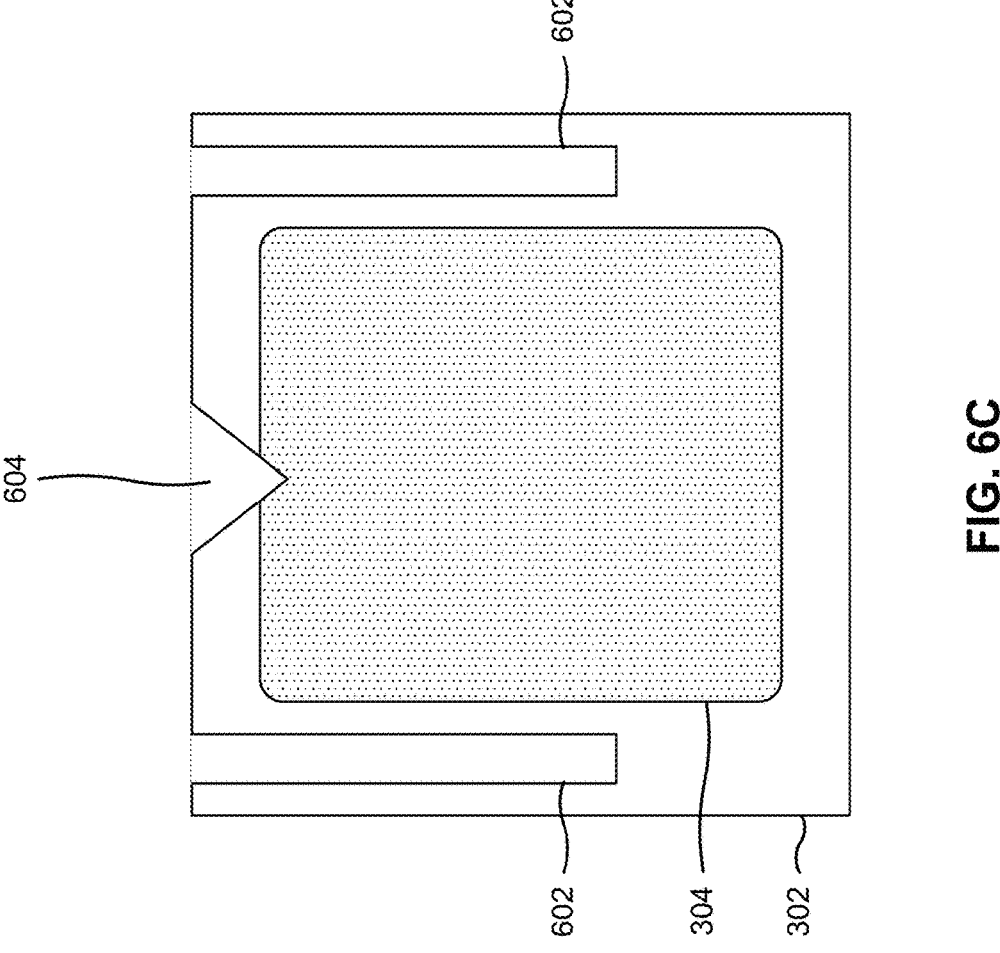

As shown in FIG. 6C, the etch tool 108 may form a recess 602 in the substrate 302 and at least partially surrounding the photodiode 304. In some implementations, the deposition tool 102 may form a photoresist layer over and/or on the frontside surface of the substrate 302, the exposure tool 104 may expose the photoresist layer to a radiation source to form a pattern on the photoresist layer, and the developer tool 106 may develop and remove portions of the photoresist layer to expose the pattern. Accordingly, the etch tool 108 may etch a portion of the substrate 302 adjacent to the photodiode 304. For example, the etch tool 108 may use a wet etch technique, a dry etch technique, a plasma-enhanced etch technique, and/or another type of etch technique to etch the portion of the substrate 302. The photoresist removal tool 114 may remove the remaining portions of the photoresist layer (e.g., using a chemical stripper, a plasma asher, and/or another technique) after the etch tool 108 etches the substrate 302.

Additionally, as shown in FIG. 6C, the etch tool 108 may form a recess 604 in the substrate 302 and at least partially extending into the photodiode 304. The recess 604 may include a shallow trench (e.g., for a shallow DTI structure, as described in connection with FIG. 3B) or a series of approximately pyramidical trenches (e.g., for a plurality of HA structures, as described in connection with FIG. 3C). In some implementations, the pattern exposed by the developer tool 106 may also allow for the etch tool 108 to form the recess 604 in addition to the recess 602.

Figure 6D:
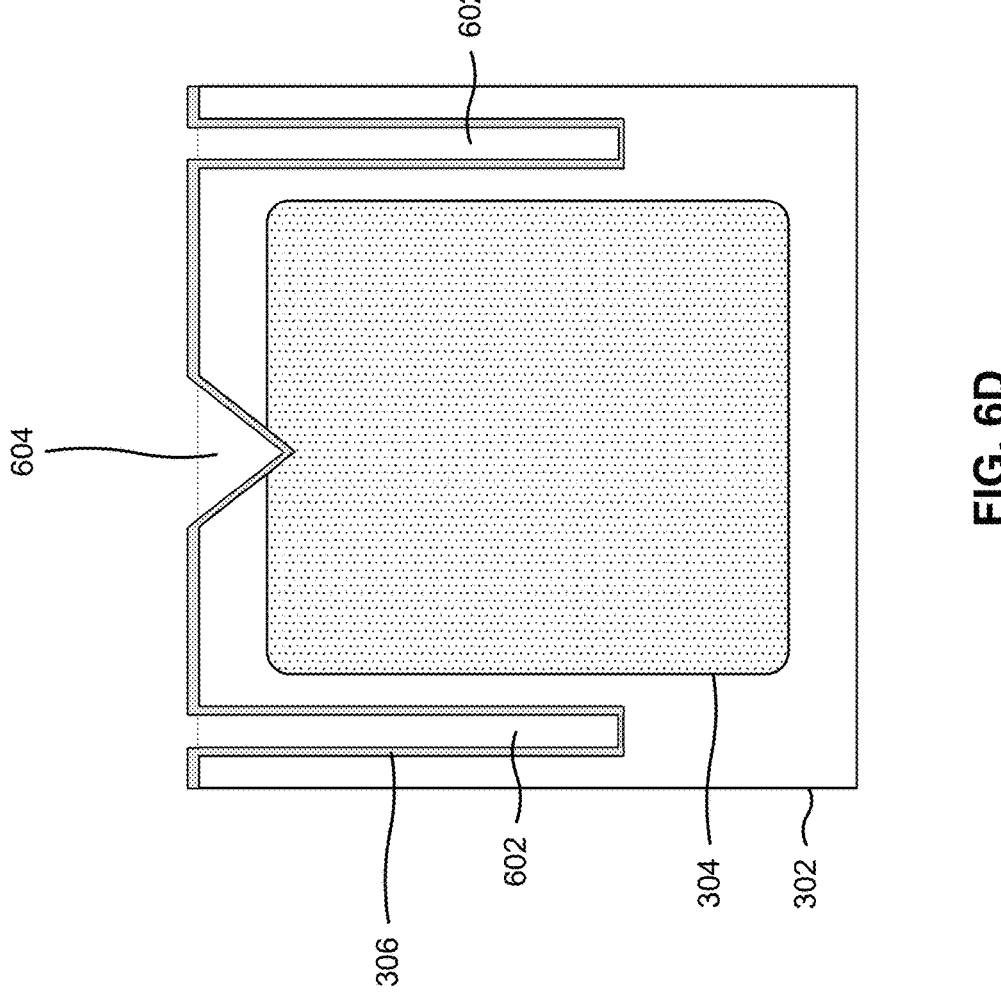

As shown in FIG. 6D, a lining layer 306 may be formed over the substrate 302. For example, the deposition tool 102 may form the lining layer 306 over and/or on the frontside surface of the substrate 302 (and thus on bottom surfaces and sidewalls of the recesses 602 and 604). In some implementations, the deposition tool 102 may form the lining layer 306 using a spin-coating technique, a CVD technique, a PVD technique, an ALD technique, and/or another deposition technique. Some implementations may include a different material deposited in the recess 602 as compared with the recess 604.

Figure 6E:
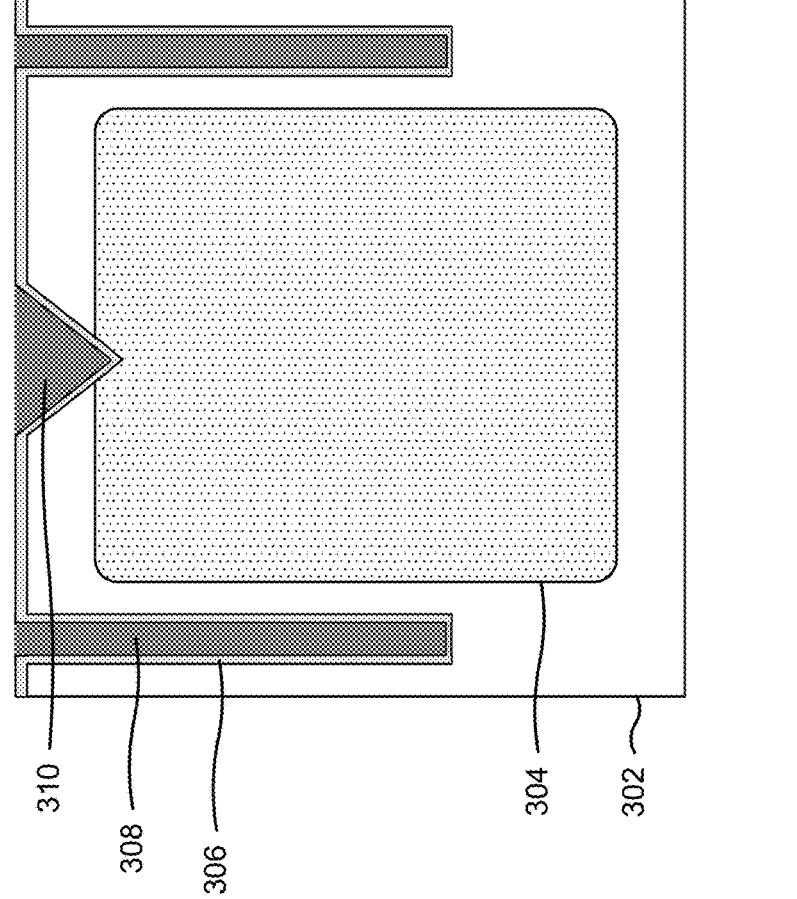

As shown in FIG. 6E, the recesses 602 and 604 may be filled with dielectric material to form the DTI structure 308 and the isolation structure 310, respectively. The deposition tool 102 may deposit the dielectric material using a spin-coating technique, a CVD technique, a PVD technique, an ALD technique, and/or another deposition technique. In some implementations, the dielectric material may overflow the recesses 602 and 604 such that the planarization tool 110 removes dielectric material outside of the recesses 602 and 604 using a CMP technique. Some implementations may include a different material used to form the DTI structure 308 as compared with the isolation structure 310.

As shown in FIG. 6F, a buffer layer 312 may be formed on the top surface of the substrate 302 over the DTI structure 308 and the isolation structure 310. The deposition tool 102 may deposit the buffer layer 312 using a CVD technique, a PVD technique, an ALD technique, or another type of deposition technique. The planarization tool 110 may planarize the buffer layer 312 after the buffer layer 312 is deposited. Additionally, as shown in FIG. 6F, a color filter layer 314 may be formed on the top surface of the substrate 302 over the buffer layer 312. The deposition tool 102 may deposit the color filter layer 314 using a CVD technique, a PVD technique, an ALD technique, or another type of deposition technique. The planarization tool 110 may planarize the color filter layer 314 after the color filter layer 314 is deposited. Additionally, as shown in FIG. 6F, a micro-lens layer 316 may be formed on the top surface of the substrate 302 over the color filter layer 314. The deposition tool 102 may deposit the micro-lens layer 316 using a CVD technique, a PVD technique, an ALD technique, or another type of deposition technique.

As indicated above, FIGS. 6A-6F are provided as examples. Other examples may differ from what is described with regard to FIGS. 6A-6F.

FIGS. 7A-7G are diagrams of an example implementation 700 described herein. Example implementation 700 may be an example process for forming the pixel sensor 300 having an isolation structure that physically partitions the photodiode. The pixel sensor formed using example implementation 700 may be included in a CMOS image sensor, a BSI CMOS image sensor, or another type of image sensor. In the example implementation 700, a DTI structure is formed before the isolation structure that physically partitions the photodiode.

Figure 7A:
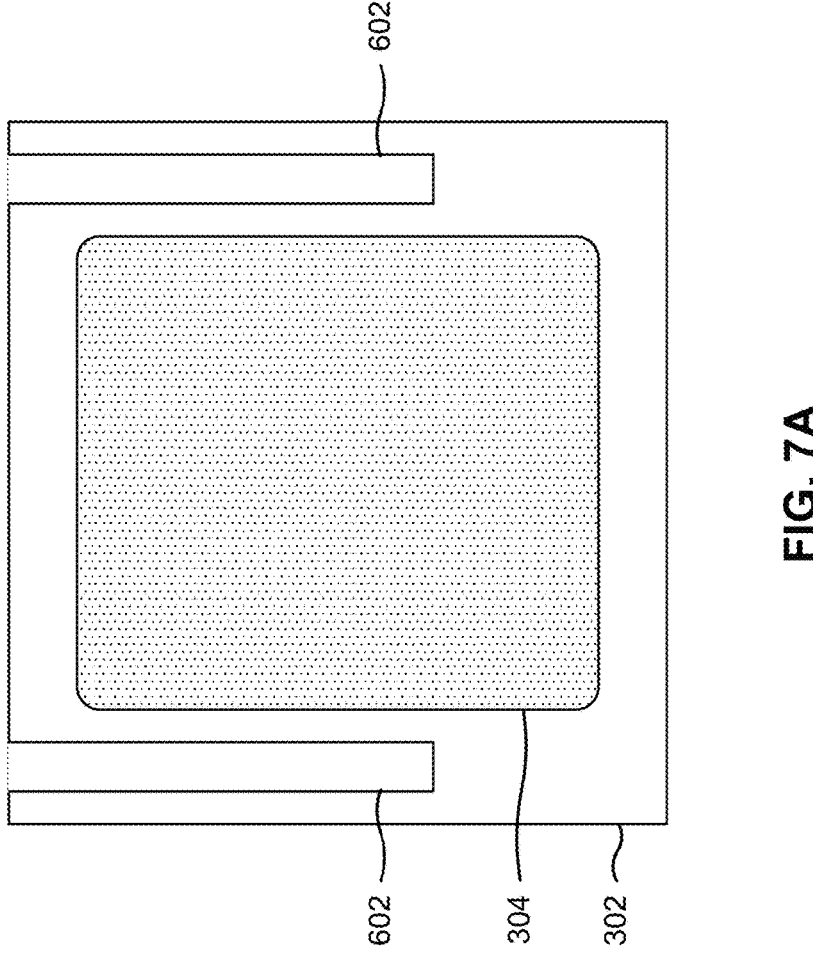
FIGS. 7A-7G are diagrams of an example implementation described herein.

As shown in FIG. 7A, the example implementation 700 may include processes described in connection with FIGS. 6A-6B. As further shown in FIG. 7A, the etch tool 108 may form a recess 602 in the substrate 302 and at least partially surrounding the photodiode 304. In some implementations, the deposition tool 102 may form a photoresist layer over and/or on the frontside surface of the substrate 302, the exposure tool 104 may expose the photoresist layer to a radiation source to form a pattern on the photoresist layer, and the developer tool 106 may develop and remove portions of the photoresist layer to expose the pattern. Accordingly, the etch tool 108 may etch a portion of the substrate 302 adjacent to the photodiode 304. For example, the etch tool 108 may use a wet etch technique, a dry etch technique, a plasma-enhanced etch technique, and/or another type of etch technique to etch the portion of the substrate 302. The photoresist removal tool 114 may remove the remaining portions of the photoresist layer (e.g., using a chemical stripper, a plasma asher, and/or another technique) after the etch tool 108 etches the substrate 302.

Figure 7B:
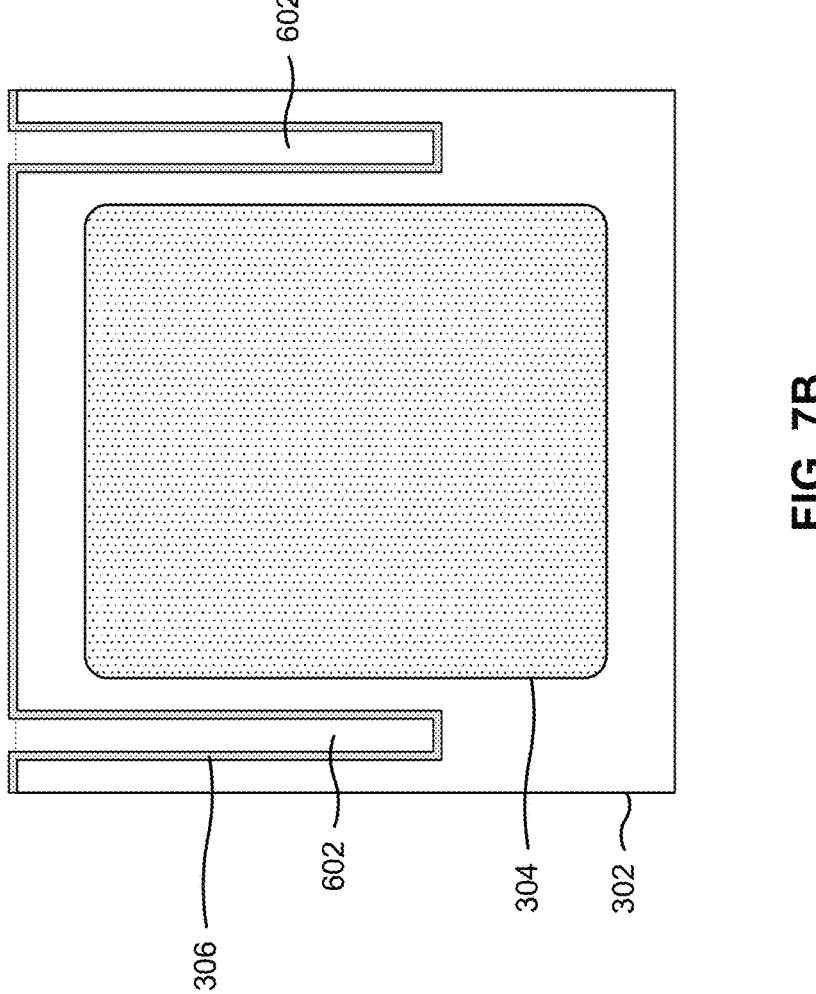

As shown in FIG. 7B, a lining layer 306 may be formed over the substrate 302. For example, the deposition tool 102 may form the lining layer 306 over and/or on the frontside surface of the substrate 302 (and thus on bottom surfaces and sidewalls of the recess 602). In some implementations, the deposition tool 102 may form the lining layer 306 using a spin-coating technique, a CVD technique, a PVD technique, an ALD technique, and/or another deposition technique.

Figure 7C:
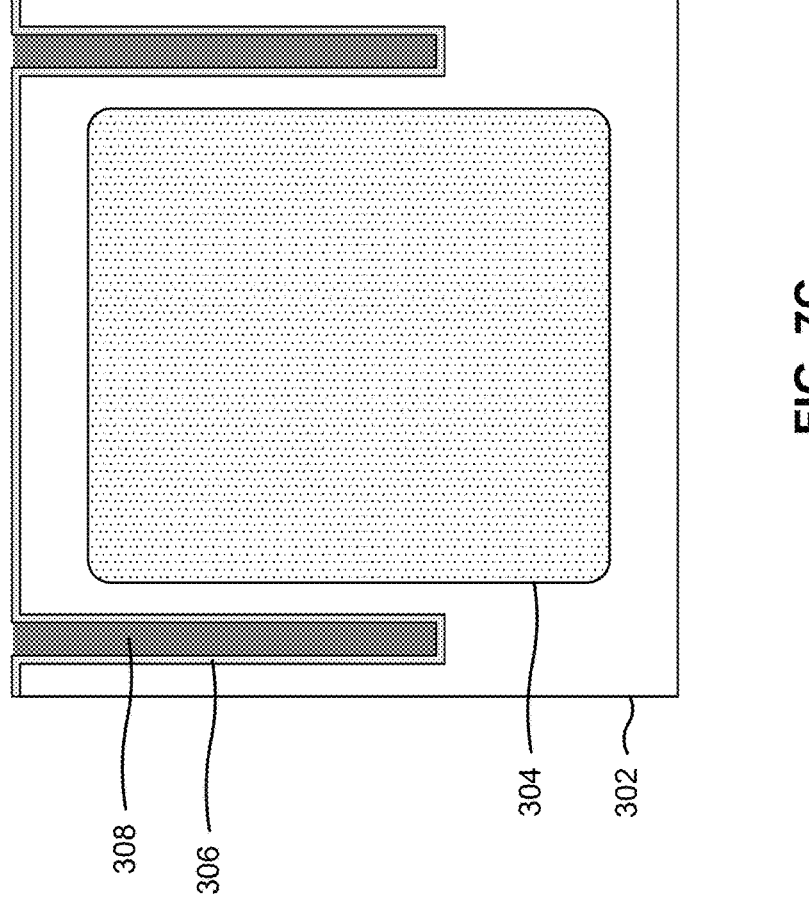

As shown in FIG. 7C, the recess 602 may be filled with dielectric material to form the DTI structure 308. The deposition tool 102 may deposit the dielectric material using a spin-coating technique, a CVD technique, a PVD technique, an ALD technique, and/or another deposition technique. In some implementations, the dielectric material may overflow the recess 602 such that the planarization tool 110 removes dielectric material outside of the recess 602 using a CMP technique.

Figure 7D:
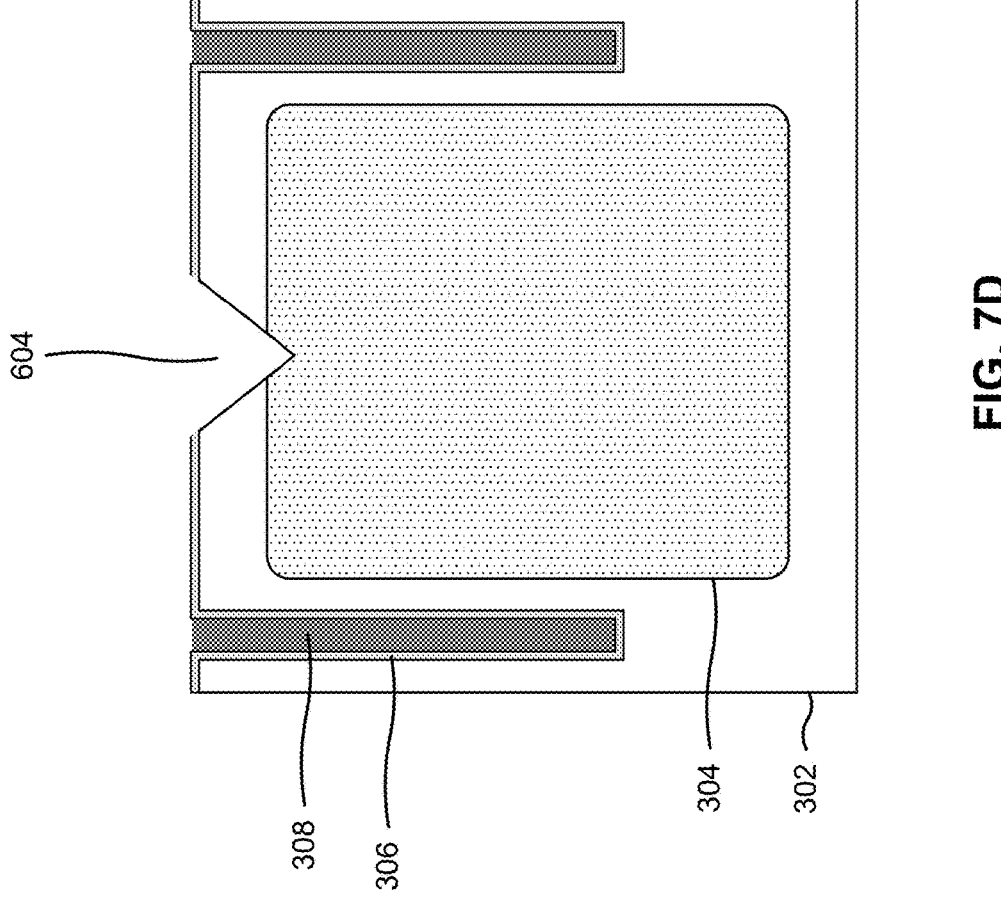

As shown in FIG. 7D, the etch tool 108 may form a recess 604 in the substrate 302 and at least partially extending into the photodiode 304. The recess 604 may include a shallow trench (e.g., for a shallow DTI structure, as described in connection with FIG. 3B) or a series of approximately pyramidical trenches (e.g., for a plurality of HA structures, as described in connection with FIG. 3C). In some implementations, the deposition tool 102 may form a photoresist layer over and/or on the frontside surface of the substrate 302, the exposure tool 104 may expose the photoresist layer to a radiation source to form a pattern on the photoresist layer, and the developer tool 106 may develop and remove portions of the photoresist layer to expose the pattern. Accordingly, the etch tool 108 may etch a portion of the substrate 302 over the photodiode 304. For example, the etch tool 108 may use a wet etch technique, a dry etch technique, a plasma-enhanced etch technique, and/or another type of etch technique to etch the portion of the substrate 302. The photoresist removal tool 114 may remove the remaining portions of the photoresist layer (e.g., using a chemical stripper, a plasma asher, and/or another technique) after the etch tool 108 etches the substrate 302.

Figure 7E:
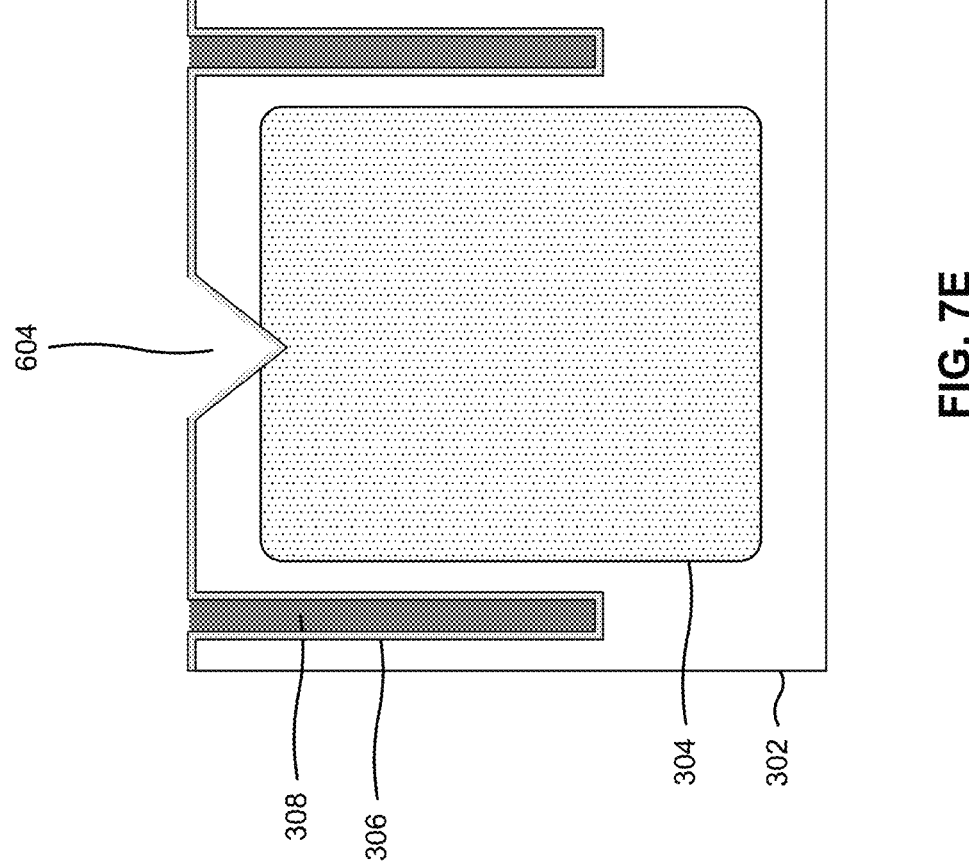

As shown in FIG. 7E, a lining layer 306 may be formed in the recess 604. In some implementations, the deposition tool 102 may form the lining layer 306 using a spin-coating technique, a CVD technique, a PVD technique, an ALD technique, and/or another deposition technique. In some implementations, the planarization tool 110 removes a portion of the lining layer 306 formed outside of the recess 604 using a CMP technique.

Figure 7F:
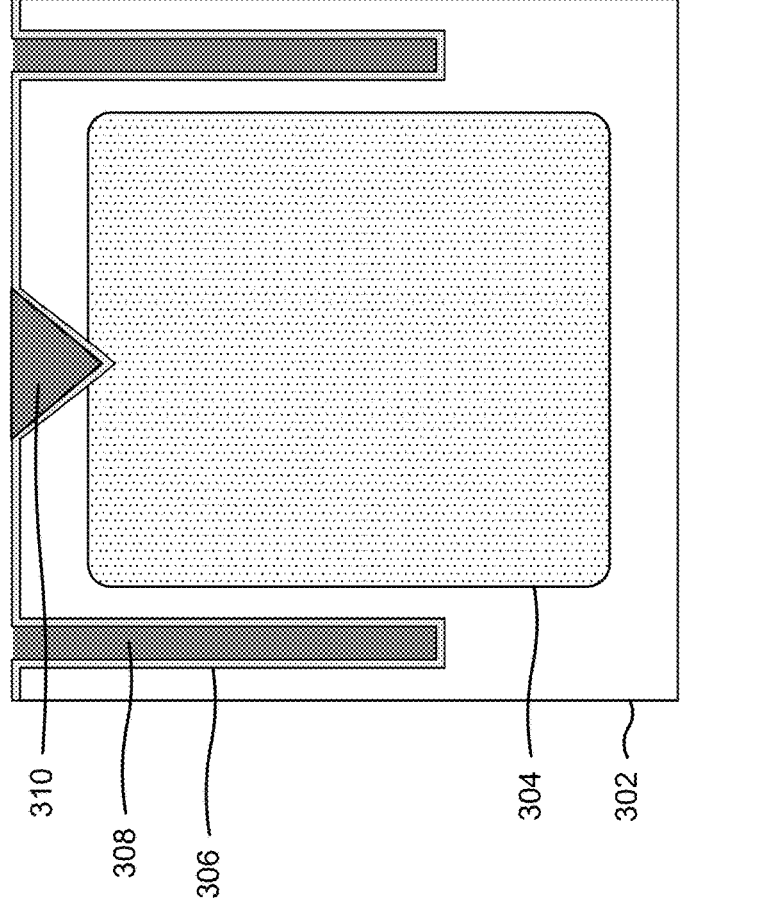
Figure 7G:
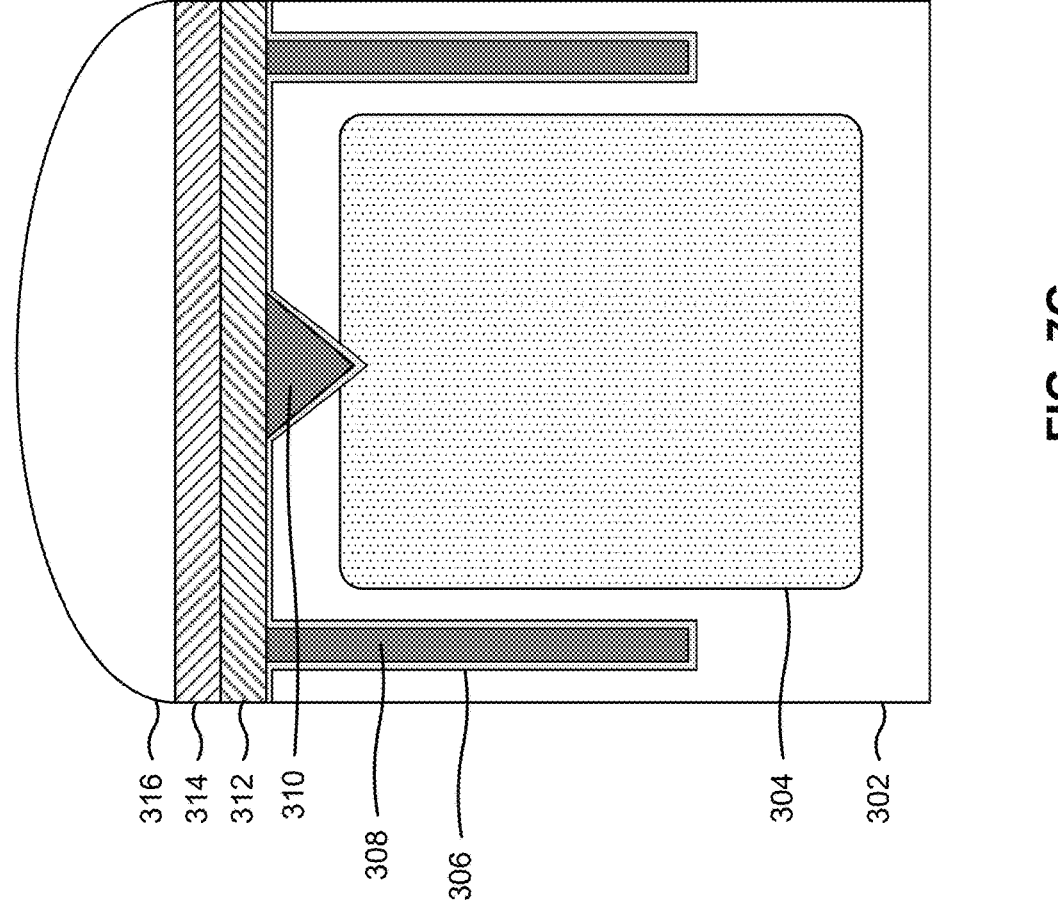

As shown in FIG. 7F, the recess 604 may be filled with dielectric material to form the isolation structure 310. The deposition tool 102 may deposit the dielectric material using a spin-coating technique, a CVD technique, a PVD technique, an ALD technique, and/or another deposition technique. In some implementations, the dielectric material may overflow the recess 604 such that the planarization tool 110 removes dielectric material outside of the recess 604 using a CMP technique.

As shown in FIG. 7G, a buffer layer 312 may be formed on the top surface of the substrate 302 over the DTI structure 308 and the isolation structure 310. The deposition tool 102 may deposit the buffer layer 312 using a CVD technique, a PVD technique, an ALD technique, or another type of deposition technique. The planarization tool 110 may planarize the buffer layer 312 after the buffer layer 312 is deposited. Additionally, as shown in FIG. 7G, a color filter layer 314 may be formed on the top surface of the substrate 302 over the buffer layer 312. The deposition tool 102 may deposit the color filter layer 314 using a CVD technique, a PVD technique, an ALD technique, or another type of deposition technique. The planarization tool 110 may planarize the color filter layer 314 after the color filter layer 314 is deposited. Additionally, as shown in FIG. 7G, a micro-lens layer 316 may be formed on the top surface of the substrate 302 over the color filter layer 314. The deposition tool 102 may deposit the micro-lens layer 316 using a CVD technique, a PVD technique, an ALD technique, or another type of deposition technique.

As indicated above, FIGS. 7A-7G are provided as examples. Other examples may differ from what is described with regard to FIGS. 7A-7G.

FIGS. 8A-8G are diagrams of an example implementation 800 described herein. Example implementation 800 may be an example process for forming the pixel sensor 300 having an isolation structure that physically partitions the photodiode. The pixel sensor formed using example implementation 800 may be included in a CMOS image sensor, a BSI CMOS image sensor, or another type of image sensor. In the example implementation 800, a DTI structure is formed after the isolation structure that physically partitions the photodiode.

Figure 8A:
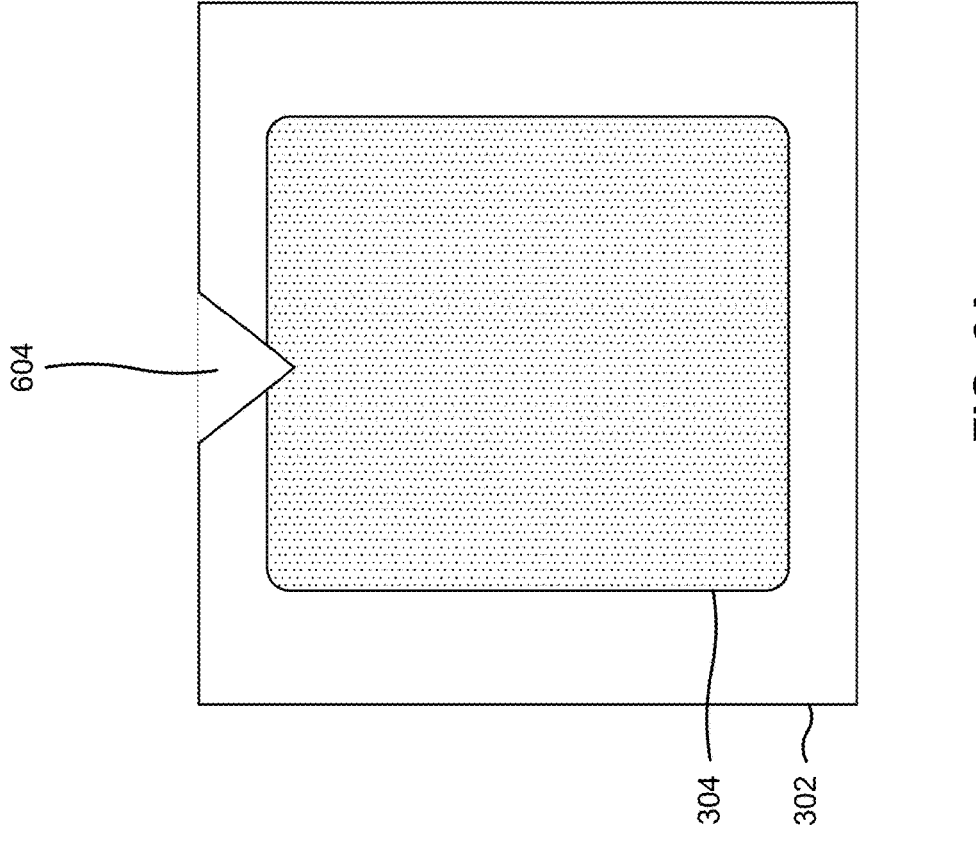
FIGS. 8A-8G are diagrams of an example implementation described herein.

As shown in FIG. 8A, the example implementation 800 may include processes described in connection with FIGS. 6A-6B. As further shown in FIG. 8A, the etch tool 108 may form a recess 604 in the substrate 302 and at least partially extending into the photodiode 304. The recess 604 may include a shallow trench (e.g., for a shallow DTI structure, as described in connection with FIG. 3B) or a series of approximately pyramidical trenches (e.g., for a plurality of HA structures, as described in connection with FIG. 3C). In some implementations, the deposition tool 102 may form a photoresist layer over and/or on the frontside surface of the substrate 302, the exposure tool 104 may expose the photoresist layer to a radiation source to form a pattern on the photoresist layer, and the developer tool 106 may develop and remove portions of the photoresist layer to expose the pattern. Accordingly, the etch tool 108 may etch a portion of the substrate 302 over the photodiode 304. For example, the etch tool 108 may use a wet etch technique, a dry etch technique, a plasma-enhanced etch technique, and/or another type of etch technique to etch the portion of the substrate 302. The photoresist removal tool 114 may remove the remaining portions of the photoresist layer (e.g., using a chemical stripper, a plasma asher, and/or another technique) after the etch tool 108 etches the substrate 302.

Figure 8B:
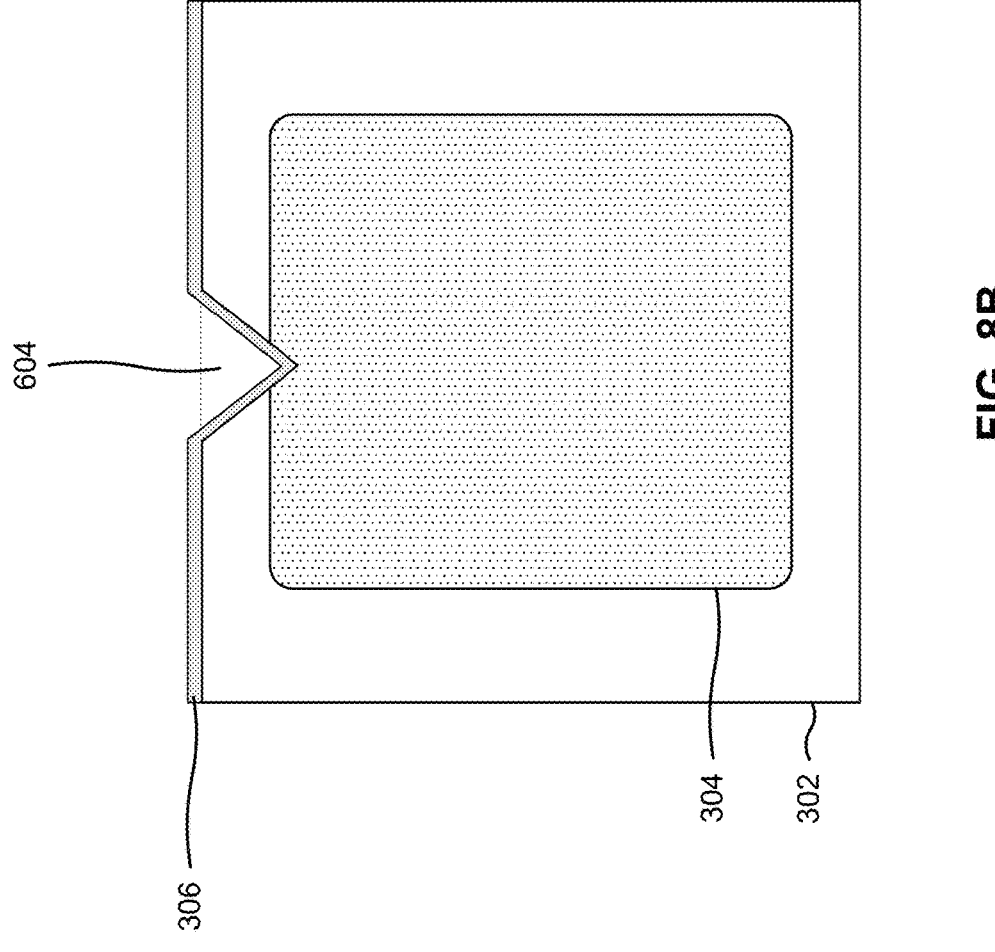

As shown in FIG. 8B, a lining layer 306 may be formed over the substrate 302. For example, the deposition tool 102 may form the lining layer 306 over and/or on the frontside surface of the substrate 302 (and thus on bottom surfaces and sidewalls of the recess 604). In some implementations, the deposition tool 102 may form the lining layer 306 using a spin-coating technique, a CVD technique, a PVD technique, an ALD technique, and/or another deposition technique.

Figure 8C:
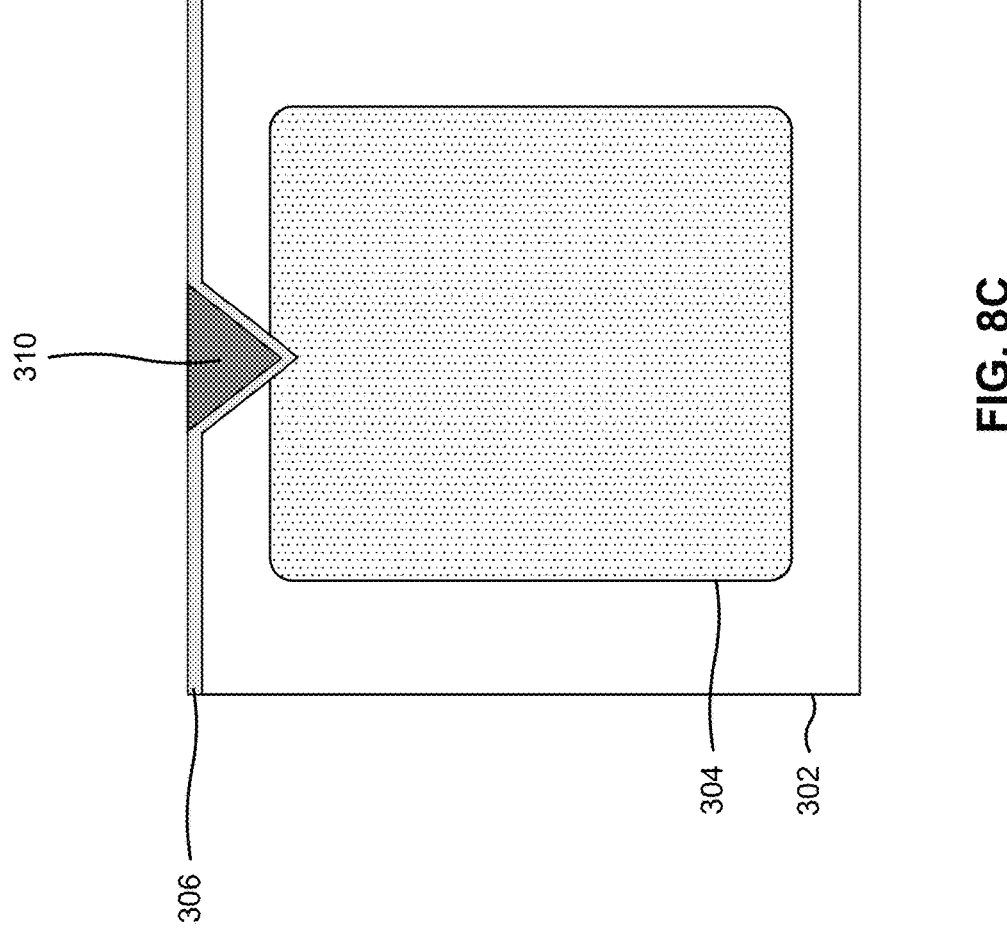

As shown in FIG. 8C, the recess 604 may be filled with dielectric material to form the isolation structure 310. The deposition tool 102 may deposit the dielectric material using a spin-coating technique, a CVD technique, a PVD technique, an ALD technique, and/or another deposition technique. In some implementations, the dielectric material may overflow the recess 604 such that the planarization tool 110 removes dielectric material outside of the recess 604 using a CMP technique.

Figure 8D:
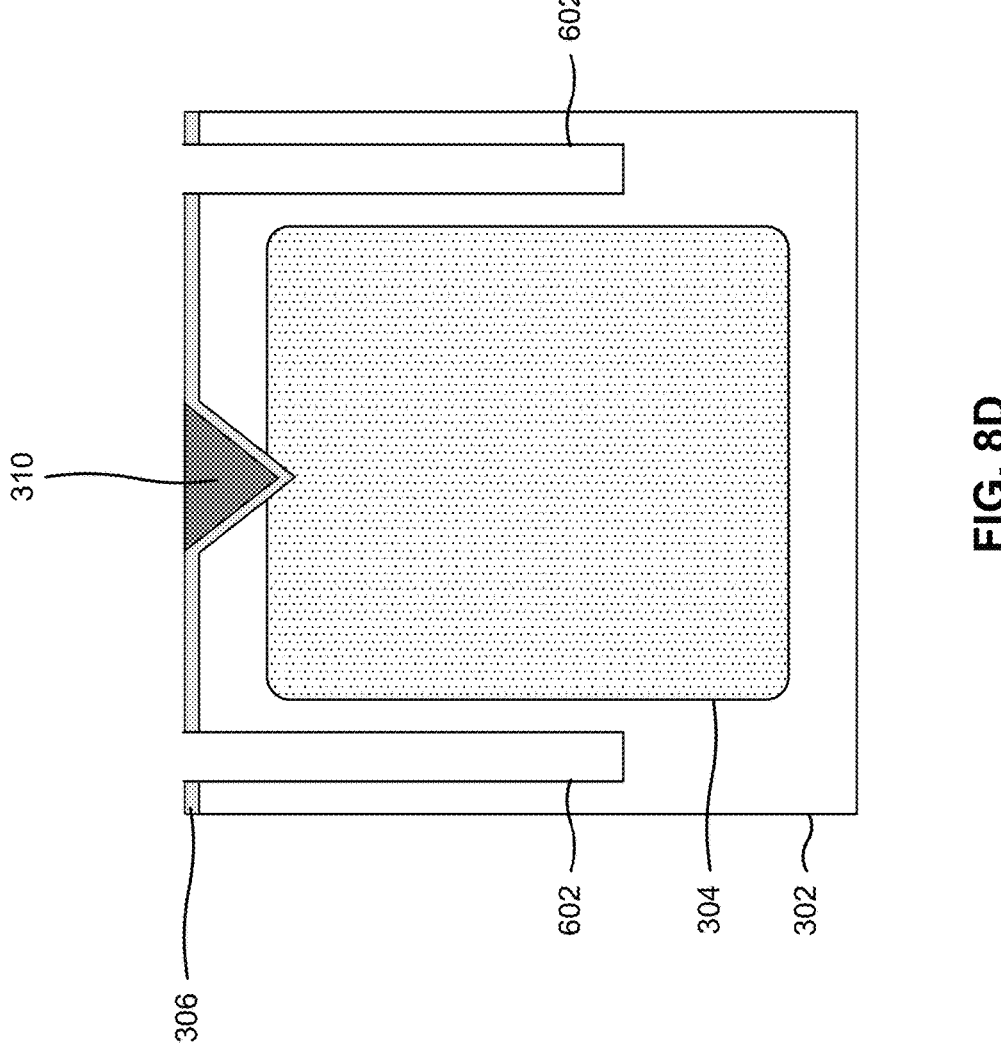

As shown in FIG. 8D, the etch tool 108 may form a recess 602 in the substrate 302 and at least partially surrounding the photodiode 304. In some implementations, the deposition tool 102 may form a photoresist layer over and/or on the frontside surface of the substrate 302, the exposure tool 104 may expose the photoresist layer to a radiation source to form a pattern on the photoresist layer, and the developer tool 106 may develop and remove portions of the photoresist layer to expose the pattern. Accordingly, the etch tool 108 may etch a portion of the substrate 302 adjacent to the photodiode 304. For example, the etch tool 108 may use a wet etch technique, a dry etch technique, a plasma-enhanced etch technique, and/or another type of etch technique to etch the portion of the substrate 302. The photoresist removal tool 114 may remove the remaining portions of the photoresist layer (e.g., using a chemical stripper, a plasma asher, and/or another technique) after the etch tool 108 etches the substrate 302.

Figure 8E:
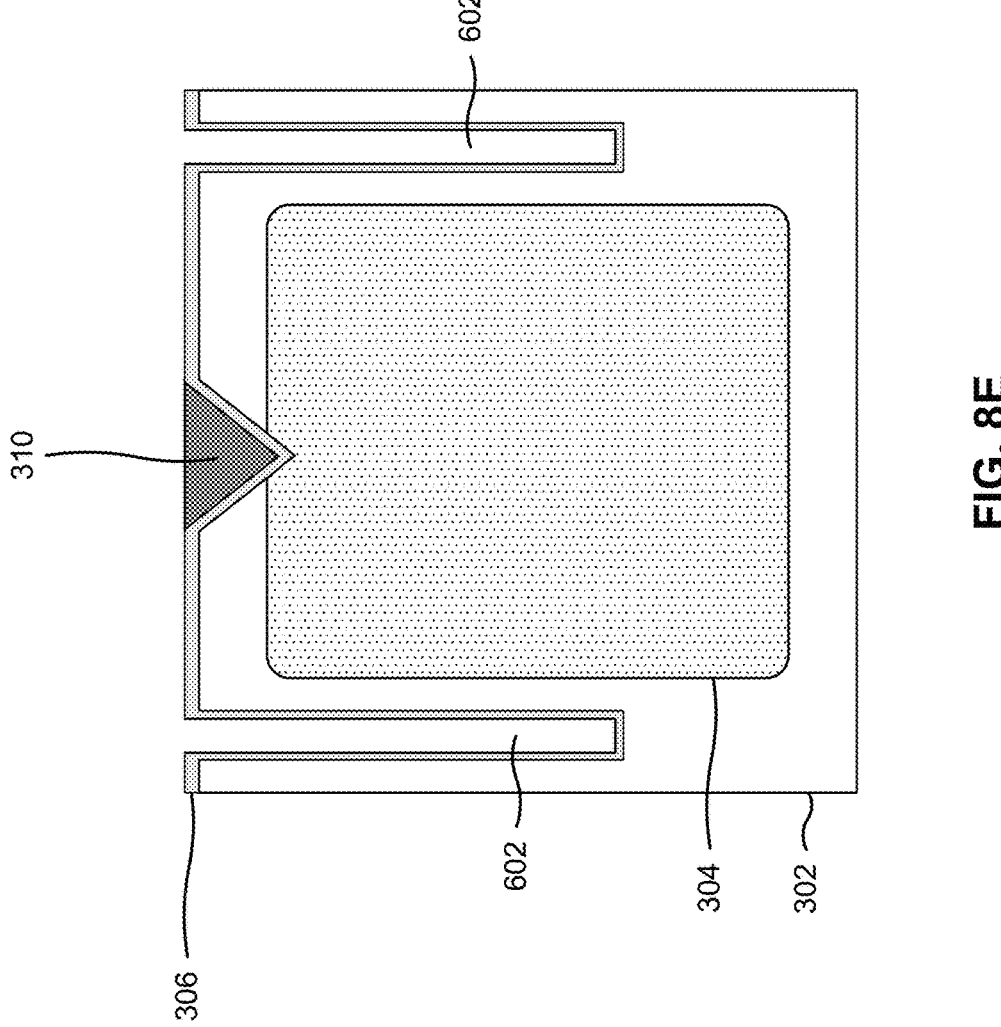

As shown in FIG. 8E, a lining layer 306 may be formed in the recess 602. In some implementations, the deposition tool 102 may form the lining layer 306 using a spin-coating technique, a CVD technique, a PVD technique, an ALD technique, and/or another deposition technique. In some implementations, the planarization tool 110 removes a portion of the lining layer 306 formed outside of the recess 602 using a CMP technique.

Figure 8F:
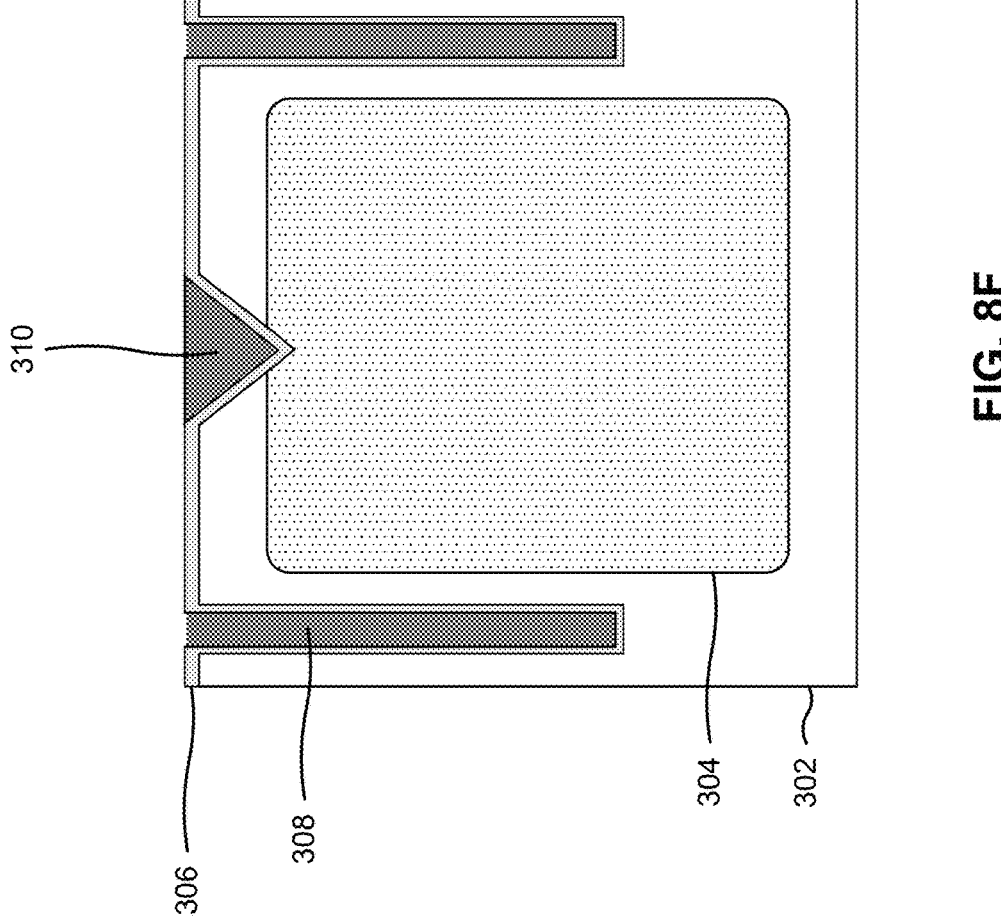
Figure 8G:
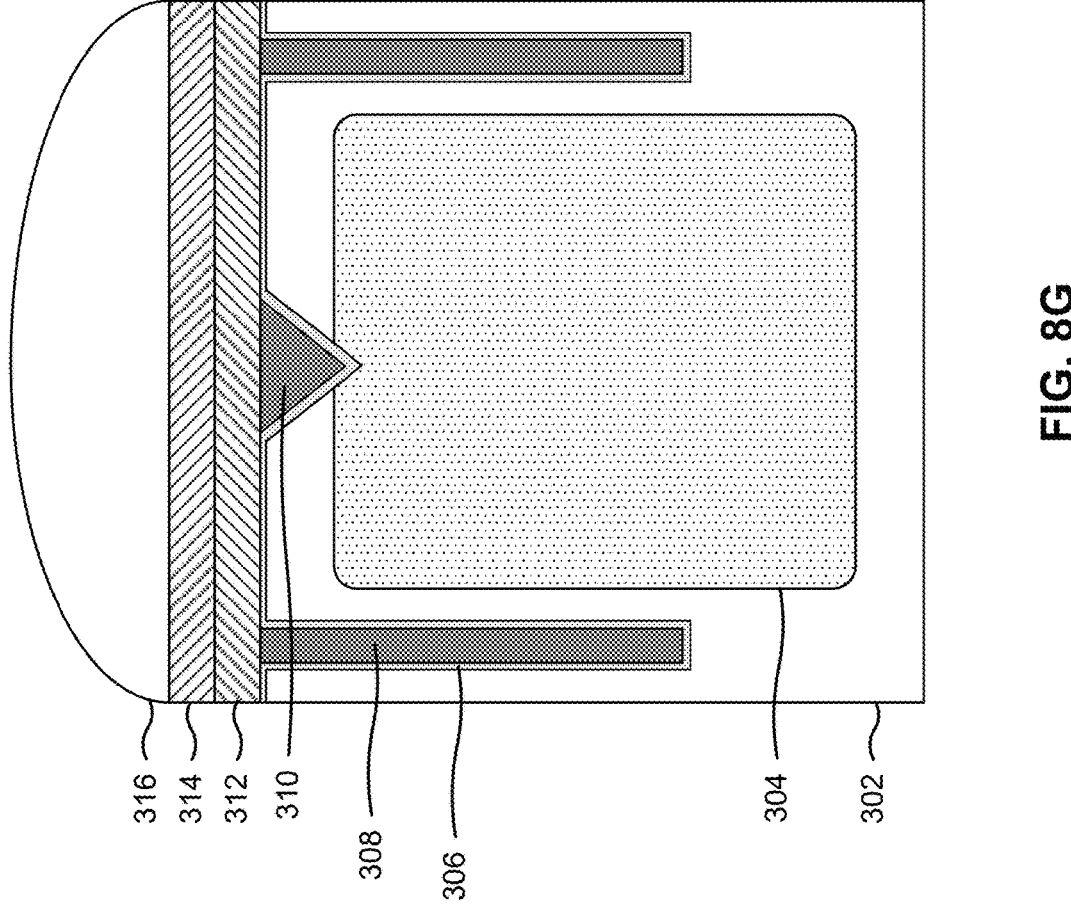

As shown in FIG. 8F, the recess 604 may be filled with dielectric material to form the isolation structure 310. The deposition tool 102 may deposit the dielectric material using a spin-coating technique, a CVD technique, a PVD technique, an ALD technique, and/or another deposition technique. In some implementations, the dielectric material may overflow the recess 604 such that the planarization tool 110 removes dielectric material outside of the recess 604 using a CMP technique.

As shown in FIG. 8G, a buffer layer 312 may be formed on the top surface of the substrate 302 over the DTI structure 308 and the isolation structure 310. The deposition tool 102 may deposit the buffer layer 312 using a CVD technique, a PVD technique, an ALD technique, or another type of deposition technique. The planarization tool 110 may planarize the buffer layer 312 after the buffer layer 312 is deposited. Additionally, as shown in FIG. 8G, a color filter layer 314 may be formed on the top surface of the substrate 302 over the buffer layer 312. The deposition tool 102 may deposit the color filter layer 314 using a CVD technique, a PVD technique, an ALD technique, or another type of deposition technique. The planarization tool 110 may planarize the color filter layer 314 after the color filter layer 314 is deposited. Additionally, as shown in FIG. 8G, a micro-lens layer 316 may be formed on the top surface of the substrate 302 over the color filter layer 314. The deposition tool 102 may deposit the micro-lens layer 316 using a CVD technique, a PVD technique, an ALD technique, or another type of deposition technique.

As indicated above, FIGS. 8A-8G are provided as examples. Other examples may differ from what is described with regard to FIGS. 8A-8G.

Figure 9A:
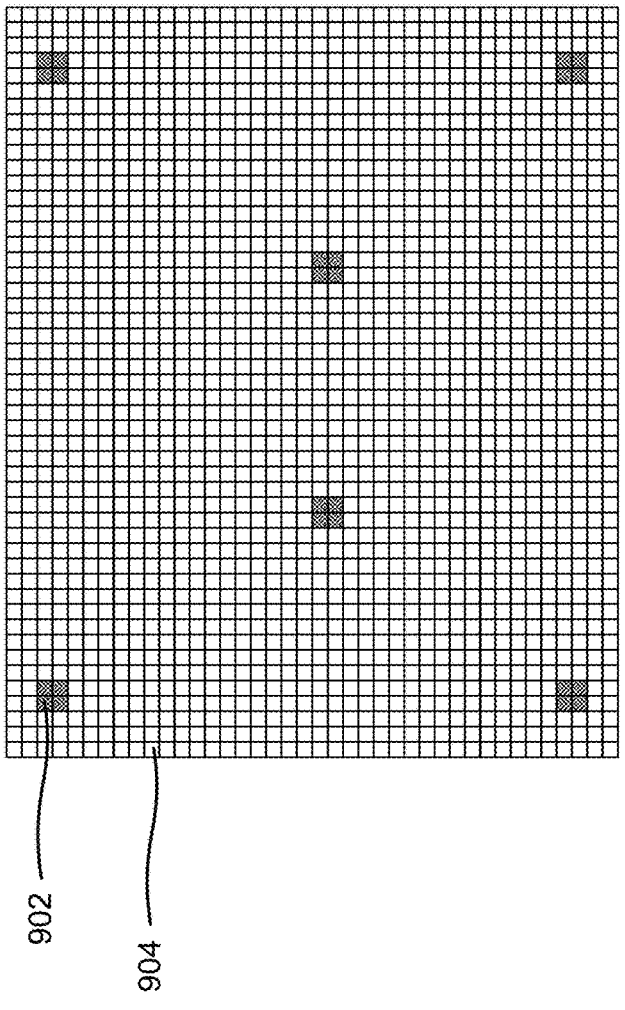
FIGS. 9A-9D are diagrams of example pixel arrays described herein.

FIGS. 9A-9D are diagrams of example pixel arrays described herein. FIG. 9A illustrates a top-down view of a pixel array 900. In some implementations, the pixel array 900 may be included in an image sensor. The image sensor may be a CMOS image sensor, a BSI CMOS image sensor, or another type of image sensor.

As shown in FIG. 9A, the pixel array 900 includes a plurality of pixel sensors with isolation structures (e.g., pixel sensor 902) and a plurality of pixel sensors without isolation structures (e.g., pixel sensor 904). The pixel sensors with isolation structures are clustered in groups to four (e.g., as described in connection with FIGS. 5A-5H) in order to perform lens adjustment. Distributing the clusters throughout the pixel array 900 can increase an accuracy of a phase estimate. The pixel array 900 is shown with six clusters of pixel sensors with isolation structures, but additional or fewer clusters may be used. The pixel sensors without isolation structures may exhibit slightly increased sensitivity relative to the pixel sensors with isolation structures.

Figure 9B:
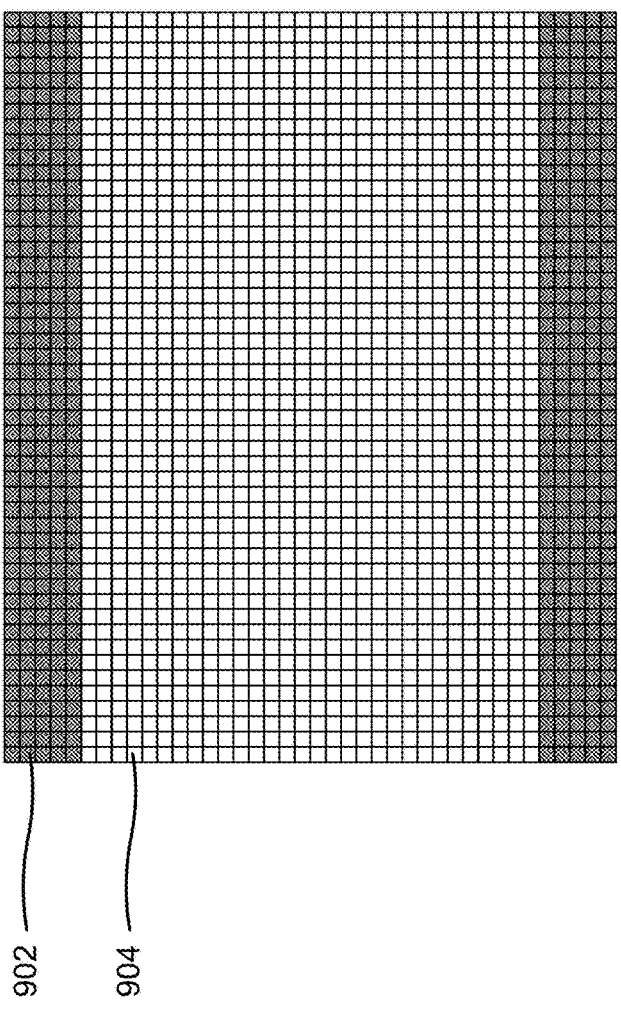
Figure 9B:

FIG. 9B illustrates a top-down view of a pixel array 910. In some implementations, the pixel array 910 may be included in an image sensor. The image sensor may be a CMOS image sensor, a BSI CMOS image sensor, or another type of image sensor.

As shown in FIG. 9B, the pixel array 910 includes a plurality of pixel sensors with isolation structures (e.g., pixel sensor 902) and a plurality of pixel sensors without isolation structures (e.g., pixel sensor 904). The pixel sensors with isolation structures are clustered in rows on a top and a bottom of the pixel array 910. The pixel array 910 is shown with five rows of pixel sensors with isolation structures, but additional or fewer rows may be used. As a result, the pixel sensors with isolation structures may be formed separately from the pixel sensors without isolation structures and combined in a single image sensor, which reduces fabrication time as compared with forming the pixel sensors with isolation structures and the pixel sensors without isolation structures together.

Figure 9C:
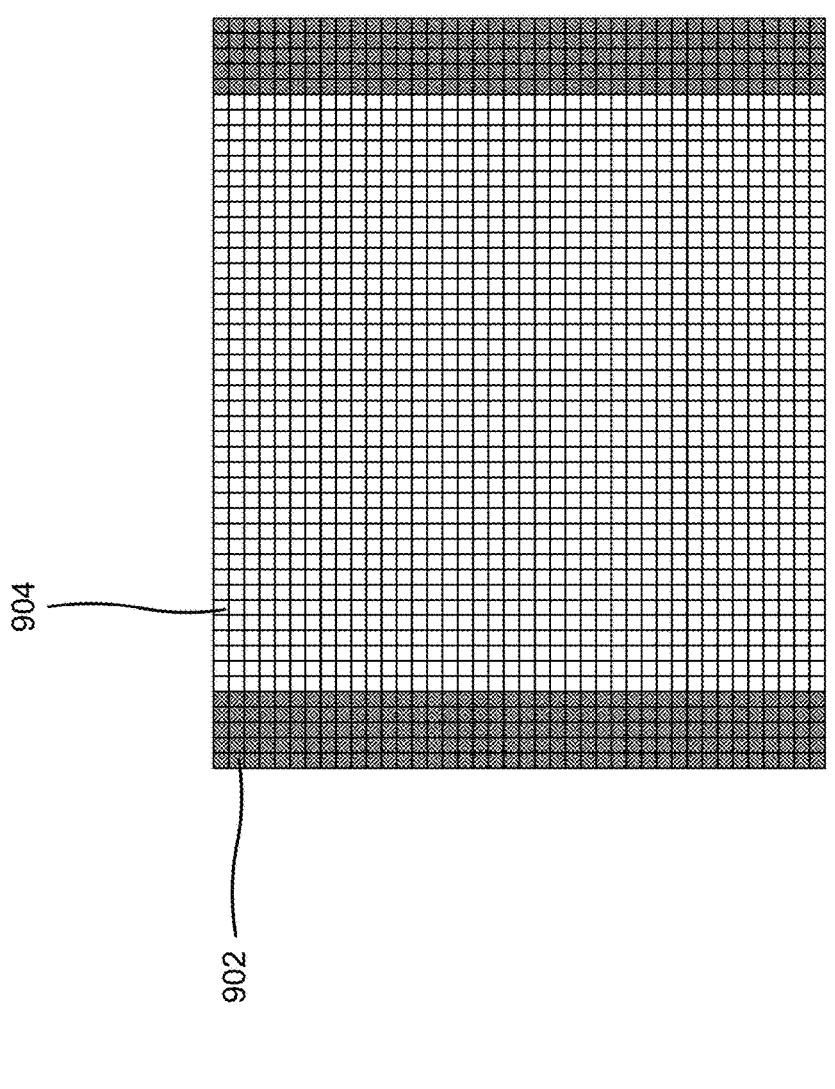

FIG. 9C illustrates a top-down view of a pixel array 920. In some implementations, the pixel array 920 may be included in an image sensor. The image sensor may be a CMOS image sensor, a BSI CMOS image sensor, or another type of image sensor.

As shown in FIG. 9C, the pixel array 920 includes a plurality of pixel sensors with isolation structures (e.g., pixel sensor 902) and a plurality of pixel sensors without isolation structures (e.g., pixel sensor 904). The pixel sensors with isolation structures are clustered in columns on sides of the pixel array 920. The pixel array 920 is shown with five columns of pixel sensors with isolation structures, but additional or fewer columns may be used. As a result, the pixel sensors with isolation structures may be formed separately from the pixel sensors without isolation structures and combined in a single image sensor, which reduces fabrication time as compared with forming the pixel sensors with isolation structures and the pixel sensors without isolation structures together.

Figure 9D:
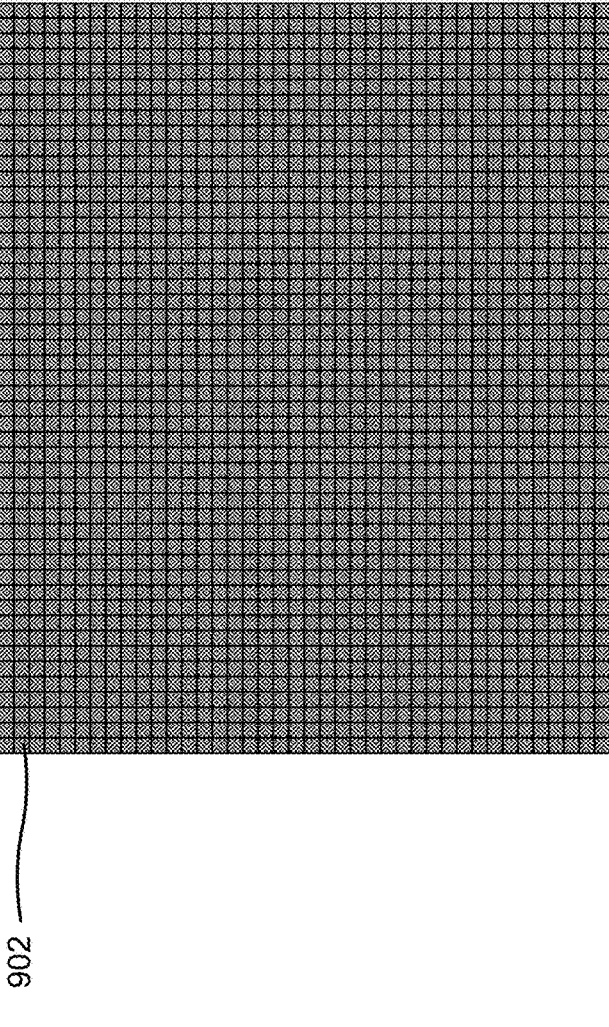

FIG. 9D illustrates a top-down view of a pixel array 930. In some implementations, the pixel array 930 may be included in an image sensor. The image sensor may be a CMOS image sensor, a BSI CMOS image sensor, or another type of image sensor. As shown in FIG. 9D, the pixel array 900 includes all pixel sensors with isolation structures (e.g., pixel sensor 902) and no pixel sensors without isolation structures (e.g., no pixel sensor 904). As a result, the pixel array 900 may be formed on a single wafer and/or using a single process, which reduces fabrication time as compared with using separate processes to form the pixel sensors with isolation structures and the pixel sensors without isolation structures.

As indicated above, FIGS. 9A-9D are provided as examples. Other examples may differ from what is described with regard to FIGS. 9A-9D.

Figure 10:
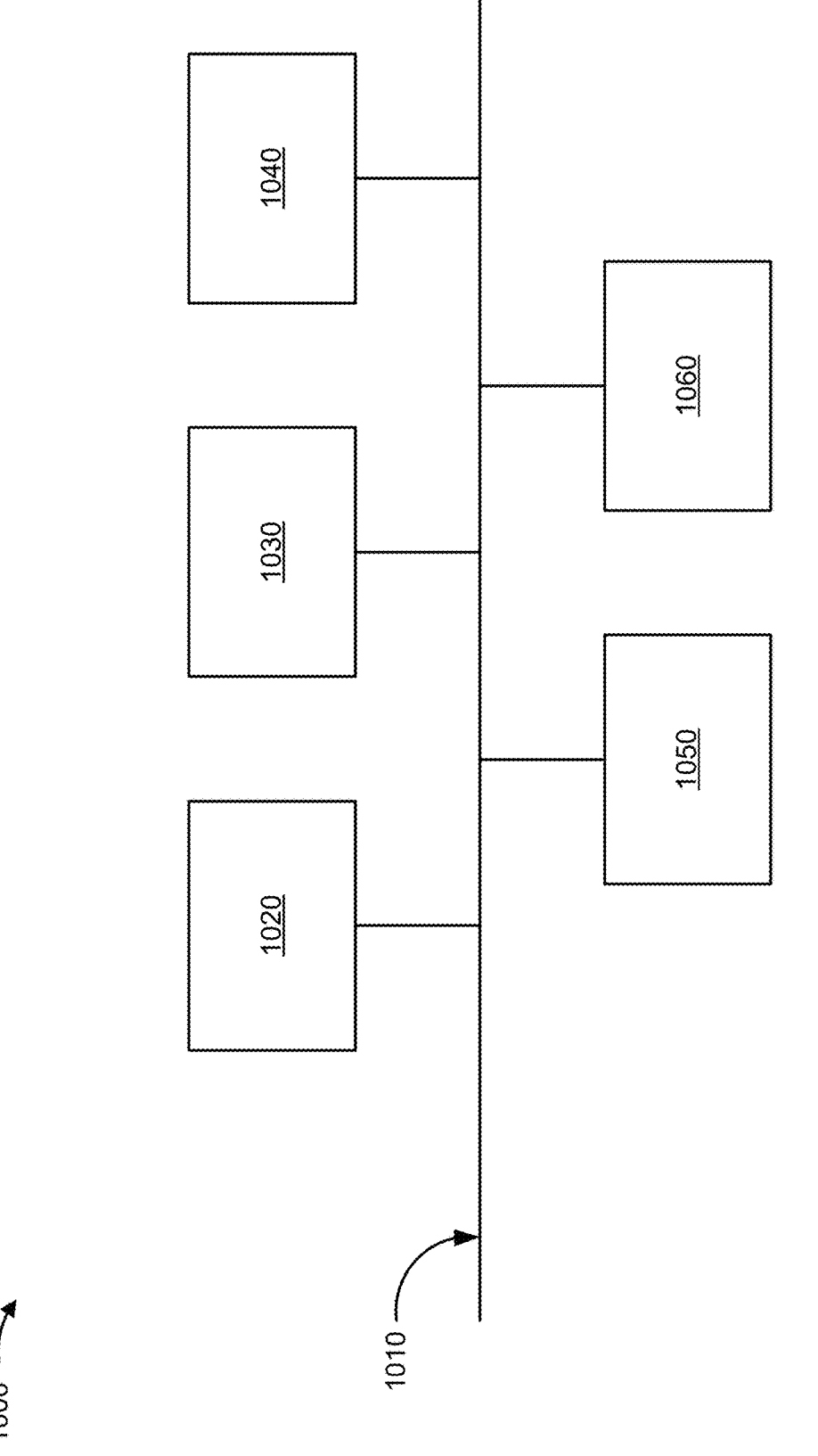
FIG. 10 is a diagram of example components of one or more devices of FIG. 1 described herein.

FIG. 10 is a diagram of example components of a device 1000 described herein. In some implementations, one or more of the semiconductor processing tools 102-116 and/or the wafer/die transport tool 118 may include one or more devices 1000 and/or one or more components of device 1000. As shown in FIG. 10, device 1000 may include a bus 1010, a processor 1020, a memory 1030, an input component 1040, an output component 1050, and a communication component 1060.

Bus 1010 may include one or more components that enable wired and/or wireless communication among the components of device 1000. Bus 1010 may couple together two or more components of FIG. 10, such as via operative coupling, communicative coupling, electronic coupling, and/or electric coupling. Processor 1020 may include a central processing unit, a graphics processing unit, a microprocessor, a controller, a microcontroller, a digital signal processor, a field-programmable gate array, an application-specific integrated circuit, and/or another type of processing component. Processor 1020 is implemented in hardware, firmware, or a combination of hardware and software. In some implementations, processor 1020 may include one or more processors capable of being programmed to perform one or more operations or processes described elsewhere herein.

Memory 1030 may include volatile and/or nonvolatile memory. For example, memory 1030 may include random access memory (RAM), read only memory (ROM), a hard disk drive, and/or another type of memory (e.g., a flash memory, a magnetic memory, and/or an optical memory). Memory 1030 may include internal memory (e.g., RAM, ROM, or a hard disk drive) and/or removable memory (e.g., removable via a universal serial bus connection). Memory 1030 may be a non-transitory computer-readable medium. Memory 1030 stores information, instructions, and/or software (e.g., one or more software applications) related to the operation of device 1000. In some implementations, memory 1030 may include one or more memories that are coupled to one or more processors (e.g., processor 1020), such as via bus 1010.

Input component 1040 enables device 1000 to receive input, such as user input and/or sensed input. For example, input component 1040 may include a touch screen, a keyboard, a keypad, a mouse, a button, a microphone, a switch, a sensor, a global positioning system sensor, an accelerometer, a gyroscope, and/or an actuator. Output component 1050 enables device 1000 to provide output, such as via a display, a speaker, and/or a light-emitting diode. Communication component 1060 enables device 1000 to communicate with other devices via a wired connection and/or a wireless connection. For example, communication component 1060 may include a receiver, a transmitter, a transceiver, a modem, a network interface card, and/or an antenna.

Device 1000 may perform one or more operations or processes described herein. For example, a non-transitory computer-readable medium (e.g., memory 1030) may store a set of instructions (e.g., one or more instructions or code) for execution by processor 1020. Processor 1020 may execute the set of instructions to perform one or more operations or processes described herein. In some implementations, execution of the set of instructions, by one or more processors 1020, causes the one or more processors 1020 and/or the device 1000 to perform one or more operations or processes described herein. In some implementations, hardwired circuitry is used instead of or in combination with the instructions to perform one or more operations or processes described herein. Additionally, or alternatively, processor 1020 may be configured to perform one or more operations or processes described herein. Thus, implementations described herein are not limited to any specific combination of hardware circuitry and software.

The number and arrangement of components shown in FIG. 10 are provided as an example. Device 1000 may include additional components, fewer components, different components, or differently arranged components than those shown in FIG. 10. Additionally, or alternatively, a set of components (e.g., one or more components) of device 1000 may perform one or more functions described as being performed by another set of components of device 1000.

Figure 11:
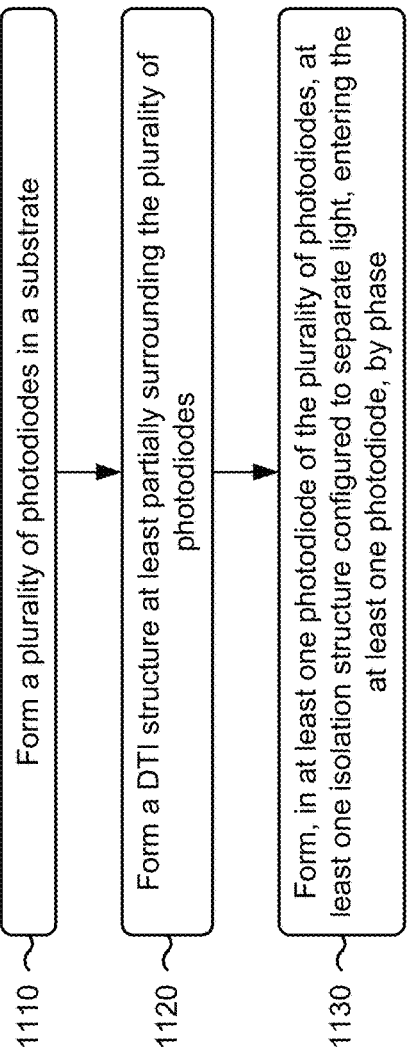
FIG. 11 is a flowchart of an example process associated with forming a semiconductor structure described herein.

FIG. 11 is a flowchart of an example process 1100 associated with forming structures for phase detection auto focus. In some implementations, one or more process blocks of FIG. 11 are performed by one or more semiconductor processing tools (e.g., one or more of the semiconductor processing tools 102-116). Additionally, or alternatively, one or more process blocks of FIG. 11 may be performed by one or more components of device 1000, such as processor 1020, memory 1030, input component 1040, output component 1050, and/or communication component 1060.

As shown in FIG. 11, process 1100 may include forming a plurality of photodiodes in a substrate (block 1110). For example, one or more of the semiconductor processing tools 102-116 may form a plurality of photodiodes 304 in a substrate 302, as described herein.

As further shown in FIG. 11, process 1100 may include forming a DTI structure at least partially surrounding the plurality of photodiodes (block 1120). For example, one or more of the semiconductor processing tools 102-116 may form a DTI structure 308 at least partially surrounding the plurality of photodiodes 304, as described herein.

As further shown in FIG. 11, process 1100 may include forming, in at least one photodiode of the plurality of photodiodes, at least one isolation structure configured to separate light, entering the at least one photodiode, by phase (block 1130). For example, one or more of the semiconductor processing tools 102-116 may form, in at least one photodiode of the plurality of photodiodes 304, at least one isolation structure 310 configured to separate light, entering the at least one photodiode, by phase, as described herein.

Process 1100 may include additional implementations, such as any single implementation or any combination of implementations described below and/or in connection with one or more other processes described elsewhere herein.

In a first implementation, forming the DTI structure 308 includes forming a trench 602 at least partially surrounding the plurality of photodiodes 304, forming a lining layer 306 on sidewalls of the trench 602, and filling the trench 602 with a dielectric material to form the DTI structure 308.

In a second implementation, alone or in combination with the first implementation, forming the at least one isolation structure 310 includes forming at least one trench 604 in the at least one photodiode, forming a lining layer 306 on sidewalls of the at least one trench 604, and filling the at least one trench 604 with a dielectric material to form the at least one isolation structure 310.

In a third implementation, alone or in combination with one or more of the first and second implementations, forming the at least one isolation structure includes forming a plurality of trenches 604 in the at least one photodiode and forming a plurality of HA structures 310, in the plurality of trenches 604, arranged along at least one line.

In a fourth implementation, alone or in combination with one or more of the first through third implementations, process 1100 includes forming trenches 602 and 604, for the DTI structure 308 and the at least one isolation structure 310, in a same etching cycle.

In a fifth implementation, alone or in combination with one or more of the first through fourth implementations, process 1100 includes forming at least one first trench 602, for the DTI structure 308, in a first etching cycle, and forming at least one second trench 604, for the at least one isolation structure 310, in a second etching cycle.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

FIG. 12 is a flowchart of an example process 1200 associated with using structures described herein phase detection auto focus. In some implementations, one or more process blocks of FIG. 12 are performed by an image sensor device (e.g., including one or more pixels as described herein). Additionally, or alternatively, one or more process blocks of FIG. 12 may be performed by one or more components of device 1000, such as processor 1020, memory 1030, input component 1040, output component 1050, and/or communication component 1060.

As shown in FIG. 12, process 1200 may include receiving first signals from a first photodiode physically partitioned by at least one isolation structure (block 1210). For example, the image sensor device may receive first signals from a first photodiode 304-1 physically partitioned by at least one isolation structure 310-1, as described herein.

As further shown in FIG. 12, process 1200 may include receiving second signals from a second photodiode physically partitioned by at least one isolation structure (block 1220). For example, the image sensor device may receive second signals from a second photodiode 304-2 physically partitioned by at least one isolation structure 310-2, as described herein.

As further shown in FIG. 12, process 1200 may include combining the first signals with the second signals to estimate a phase along a first direction (block 1230). For example, the image sensor device may combine the first signals with the second signals to estimate a phase along a first direction, as described herein.

As further shown in FIG. 12, process 1200 may include generating a command to adjust a lens based on the phase along the first direction (block 1240). For example, the image sensor device may generate a command to adjust a lens based on the phase along the first direction, as described herein.

Process 1200 may include additional implementations, such as any single implementation or any combination of implementations described below and/or in connection with one or more other processes described elsewhere herein.

In some implementations, process 1200 includes receiving third signals from a third photodiode 304-3 physically partitioned by at least one isolation structure 310-3, and combining the first signals or the second signals with the third signals to estimate a phase along a second direction perpendicular to the first direction, such that the command to adjust the lens is further based on the phase along the second direction.

Although FIG. 12 shows example blocks of process 1200, in some implementations, process 1200 includes additional blocks, fewer blocks, different blocks, or differently arranged blocks than those depicted in FIG. 12. Additionally, or alternatively, two or more of the blocks of process 1200 may be performed in parallel.

In this way, in-pixel separation structures may divide photodiodes of a pixel array into multiple regions. As a result, a lens of an image sensor device may be focused by using combining signals associated with different portions of the photodiodes. As a result, the lens may be focused faster and with fewer pixels of the pixel array, which conserves power, processing resources, and raw materials.

As described in greater detail above, some implementations described herein provide a semiconductor device. The semiconductor device includes an array of pixel sensors comprising, a photodiode that is physically partitioned by at least one isolation structure, where incoming light to the photodiode is phase separated by the at least one isolation structure. The semiconductor device includes a deep trench isolation (DTI) structure at least partially surrounding the pixel sensors of the array.

As described in greater detail above, some implementations described herein provide a method. The method includes forming a plurality of photodiodes in a substrate. The method includes forming a deep trench isolation (DTI) structure at least partially surrounding the plurality of photodiodes. The method includes forming, in at least one photodiode of the plurality of photodiodes, at least one isolation structure configured to separate light, entering the at least one photodiode, by phase.

As described in greater detail above, some implementations described herein provide a method. The method includes receiving first signals from a first photodiode physically partitioned by at least one isolation structure. The method includes receiving second signals from a second photodiode physically partitioned by at least one isolation structure. The method includes combining the first signals with the second signals to estimate a phase along a first direction. The method includes generating a command to adjust a lens based on the phase along the first direction.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an array of pixel sensors comprising:
    a substrate, and
    a photodiode that is physically partitioned by at least one isolation structure and that is entirely embedded in the substrate,
    wherein incoming light to the photodiode is phase separated by the at least one isolation structure; and
a deep trench isolation (DTI) structure at least partially surrounding the pixel sensors of the array.

2. The semiconductor device of claim 1, wherein the at least one isolation structure comprises a plurality of high absorption (HA) structures.

3. The semiconductor device of claim 2, wherein each of the HA structures has a width that is in a range from approximately 0.2 micrometers (μm) to approximately 1.0 μm.

4. The semiconductor device of claim 1, wherein the at least one isolation structure comprises a shallow DTI structure.

5. The semiconductor device of claim 1, wherein the at least one isolation structure has an angle, relative to an axis of the photodiode, in a range from approximately 0 degrees to approximately 75 degrees.

6. The semiconductor device of claim 5, wherein the axis of the photodiode is a vertical axis of the array.

7. The semiconductor device of claim 5, wherein the axis of the photodiode is a horizontal axis of the array.

8. The semiconductor device of claim 1, wherein the at least one isolation structure comprises a single isolation structure that divides the photodiode approximately in halves.

9. The semiconductor device of claim 1, wherein the at least one isolation structure comprises a single isolation structure that divides the photodiode approximately into one-third and two-thirds.

10. The semiconductor device of claim 1, wherein the at least one isolation structure comprises two isolation structures that divide the photodiode approximately in thirds.

11. The semiconductor device of claim 1, wherein the array comprises an additional photodiode that lacks at least one isolation structure.

12. The semiconductor device of claim 1, wherein the array comprises one or more additional photodiodes that are physically partitioned.

13. A method, comprising:
forming a plurality of photodiodes in a substrate, wherein the plurality of photodiodes are entirely embedded in the substrate;
forming a deep trench isolation (DTI) structure at least partially surrounding the plurality of photodiodes; and
forming, in at least one photodiode of the plurality of photodiodes, at least one isolation structure configured to separate light, entering the at least one photodiode, by phase.

14. The method of claim 13, wherein forming the DTI structure comprises:

forming a trench at least partially surrounding the plurality of photodiodes;

forming a lining layer on sidewalls of the trench; and filling the trench with a dielectric material to form the DTI structure.

15. The method of claim 13, wherein forming the at least one isolation structure comprises:

forming at least one trench in the at least one photodiode;

forming a lining layer on sidewalls of the at least one trench; and filling the at least one trench with a dielectric material to form the at least one isolation structure.

16. The method of claim 13, wherein forming the at least one isolation structure comprises:

forming a plurality of trenches in the at least one photodiode; and forming a plurality of high absorption (HA) structures in the plurality of trenches, wherein the plurality of HA structures are arranged along at least one line.

17. The method of claim 13, further comprising:

forming trenches, for the DTI structure and the at least one isolation structure, in a same etching cycle.

18. The method of claim 13, further comprising:

forming at least one first trench, for the DTI structure, in a first etching cycle; and forming at least one second trench, for the at least one isolation structure, in a second etching cycle.

19. A method, comprising:

receiving first signals from a first photodiode physically partitioned by at least one isolation structure;

receiving second signals from a second photodiode physically partitioned by at least one isolation structure, wherein at least one of the first photodiode and the second photodiode is entirely embedded in a substrate;

combining the first signals with the second signals to estimate a phase along a first direction; and generating a command to adjust a lens based on the phase along the first direction.

20. The method of claim 19, further comprising:

receiving third signals from a third photodiode physically partitioned by at least one isolation structure; and combining the first signals or the second signals with the third signals to estimate a phase along a second direction perpendicular to the first direction, wherein the command to adjust the lens is further based on the phase along the second direction.

\* \* \* \* \*